(12) United States Patent  
Yasamura et al.

(10) Patent No.: US 7,837,477 B2
(45) Date of Patent: Nov. 23, 2010

(54) ELECTRICAL INTERCONNECTION DEVICES INCORPORATING FEDUNDANT CONTACT POINTS FOR REDUCING CAPACITIVE STUBS AND IMPROVED SIGNAL INTEGRITY

(75) Inventors: Gary Yasamura, Santa Clara, CA (US); Joseph C. Fjelstad, Maple Valley, WA (US); Kevin P. Grundy, Fremont, CA (US); William F. Wiedemann, Campbell, CA (US); Matthew J. Stepovich, Santa Cruz, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/651,970

(22) Filed: Jan. 4, 2010

(65) Prior Publication Data

US 2010/0112829 A1  May 6, 2010

Related U.S. Application Data

(60) Division of application No. 12/127,195, filed on May 27, 2008, now Pat. No. 7,651,382, which is a division of application No. 11/607,143, filed on Dec. 1, 2006, now Pat. No. 7,404,746, which is a continuation of application No. 11/093,266, filed on Mar. 28, 2005, now Pat. No. 7,192,320.

(60) Provisional application No. 60/624,519, filed on Nov. 1, 2004, provisional application No. 60/557,127, filed on Mar. 26, 2004.

(51) Int. Cl.
*H01R 12/00* (2006.01)

(52) U.S. Cl. ..................................... 439/66; 439/924.1

(58) Field of Classification Search .............. 439/924.1, 439/924.2, 285, 66
See application file for complete search history.

(56) References Cited

U.S. PATENT DOCUMENTS

| 6,036,549 | A | * | 3/2000 | Wulff | 439/660 |
| 6,179,629 | B1 | * | 1/2001 | Lai et al. | 439/79 |
| 6,790,067 | B2 | * | 9/2004 | Douty et al. | 439/284 |
| 6,802,729 | B2 | * | 10/2004 | Hermann et al. | 439/181 |
| 7,278,855 | B2 | * | 10/2007 | Yasumura et al. | 439/65 |

* cited by examiner

*Primary Examiner*—Truc T Nguyen
(74) *Attorney, Agent, or Firm*—Myers Bigel Sibley & Sajovec, P.A.

(57) ABSTRACT

An electrical interconnection device for establishing redundant contacts between the ends of two conductive elements to be mated, creating a electrical interconnection without capacitive stubs.

24 Claims, 37 Drawing Sheets

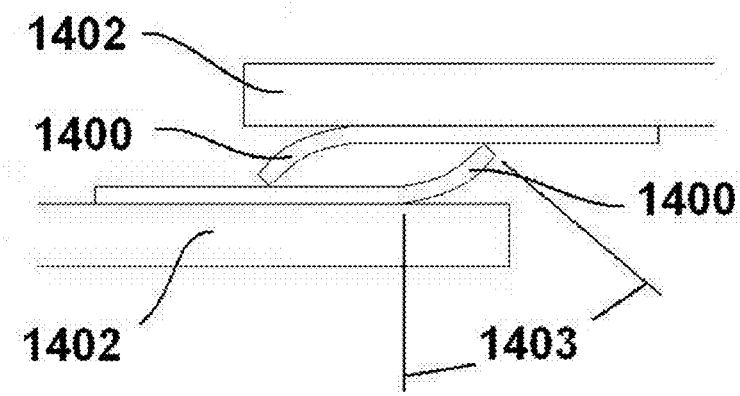
FIGURE 14B
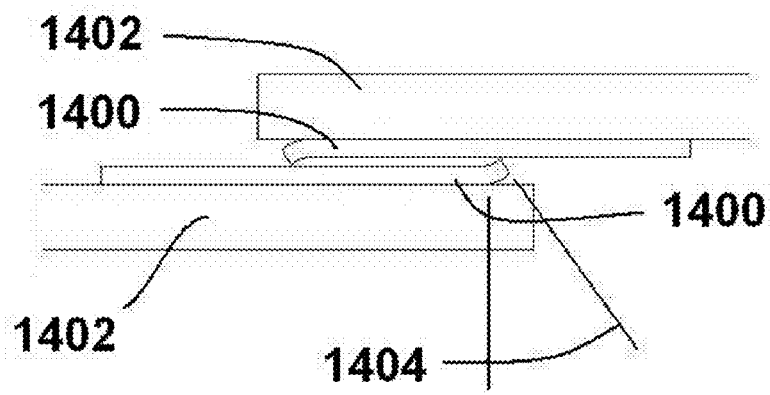
FIGURE 14C
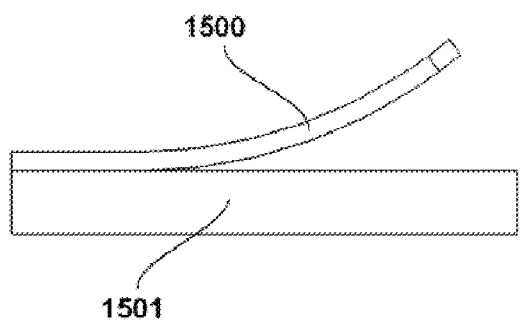 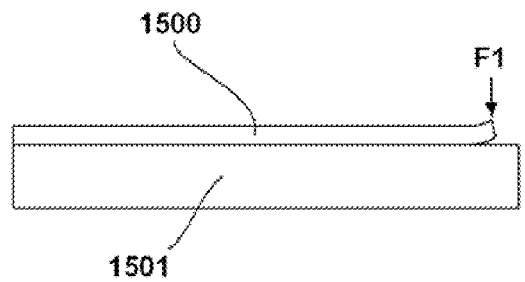
FIGURE 15A  FIGURE 15B

ELECTRICAL INTERCONNECTION DEVICES INCORPORATING FEDUNDANT CONTACT POINTS FOR REDUCING CAPACITIVE STUBS AND IMPROVED SIGNAL INTEGRITY

CROSS-REFERENCE TO RELATED APPLICATIONS

This is a divisional application of, and hereby incorporates by reference in its entirety and for all purposes, U.S. patent application Ser. No. 12/127,195, filed May 27, 2008, which is a divisional of, and incorporates by reference, U.S. Pat. No. 7,404,746, filed Dec. 1, 2006, which is a continuation of, and incorporates by reference, U.S. Pat. No. 7,192,320 filed Mar. 28, 2005, which claims the benefit of, and incorporates by reference in their entirety, U.S. Provisional Patent Application Nos. 60/557,127, filed Mar. 26, 2004, and 60/624,519 filed Nov. 1, 2004.

TECHNICAL FIELD

The disclosed embodiments relate generally to the field of electrical interconnections. More particularly, the disclosed embodiments relate to electrical interconnection devices having redundant electrical contact geometries that eliminate capacitive stubs.

BACKGROUND

Electronic systems often utilize discrete electrical components that must be connected together using structures and devices that establish electrical and mechanical contact. Electrical signals enter, traverse and exit these electromechanical connection structures, which often represent the site of significant signal degradation due to attenuation, reflection, interference or skew, any of which contribute to signal degradation that may harm the performance of the system. System architects can maintain signal integrity by utilizing connection devices that wherever possible lower inductance, reduce parasitic capacitance, minimize signal distortion and reflections, eliminate skew, and match impedance. In addition, system architects can improve signal integrity by utilizing electrical connection structures that optimize electromechanical contact force and contact wipe.

Vias, or plated through holes, in printed circuit boards are structures commonly used to establish electromechanical connections between electrical components and printed circuit boards. Vias can cause significant harm to signal integrity. FIG. 1 illustrates a prior-art electrical connector system in which the electrical connector 101 attaches to a printed circuit board 102, where the printed circuit board contains multiple layers 103. A conductive pin 104 is inserted into a plated through hole 105 (which consists of a hole 106, drilled through the printed circuit board, and an annular pad 107—both of which are plated with a conductive material). In this illustration, the plated through holes create anchor points for the electrical connector, and the plated through hole makes an electrical connection between the conductive pin 104 and a trace 108 that may be located on the surface of the printed circuit board one or more layers within the printed circuit board. Many of the structures associated with vias incorporate capacitive stubs 105, 106, 107, which degrade signal integrity.

FIG. 2 illustrates prior art showing a typical electromechanical contact assembly comprising a post 201 inserted into a tuning fork receptacle 202. The structure of this assembly may have unwanted parasitic capacitances resulting from three elements: (1) the capacitive stub formed by the portion of post 203 that extends into the assembly beyond the electrical contact points 204; (2) the capacitive stubs formed by the two projections 205 that extend away from the assembly beyond the contact points 204; and (3) the 90 degree folds 206 in the tuning fork receptacle 202.

FIG. 2A illustrates a prior art electrical connection device wherein the electrical conductor 207, makes contact with an electrical contact pad 208 at the electrical contact point 210, which moves along the electrical contact pad 208 as force is applied to the electrical conductor 207, causing a wiping motion 211 known as "contact wipe", which clears corrosion from the electrical contact pad 208 and improves the electrical connection at the electrical contact point 210. After the contact wiping motion is complete and the electrical interconnection has been established, the electrical contact pad 208 has a capacitive stub 209 to the right of the electrical interconnection point 210. The stub causes parasitic capacitance.

FIG. 3A illustrates an isometric view and an oblique side view of a common prior art electromechanical contact assembly comprising two electrical conductors 305, 306 to be brought together an mated, electrical conductor 305 having a conductive protrusion 307 is aligned toward the counterpart conductor 306. Conductive protrusion 307 focuses the force pressing conductive elements 305 and 306 together, creating a more focused area of contact. The advantage of adding a protrusion is that reducing the area where the contact force is brought to bear increases the force per unit of area at the point of contact, better overcoming corrosion and small imperfections on the surfaces of the conductive elements, both of which can cause signal degradation and can generate heat. The conductive protrusion 307 also creates capacitive stubs 308, 309, at the end of conductive elements 305 and 306, which capacitive stubs create parasitic capacitance that contributes to signal degradation.

Despite these and other efforts in the art, further improvement in cost and performance is possible by introducing novel elements, simplifying design and lowering manufacturing cost.

BRIEF DESCRIPTION OF DRAWINGS

The present invention is illustrated by way of example, and not by way of limitation, in the figures of the accompanying drawings and in which like reference numerals refer to similar elements and in which:

FIG. 14B is a continuation in time of the conductors from FIG. 14A showing how the curved conductive elements move toward each other to partially flatten them against the underlying substrate;

FIG. 14C illustrates the curved conductive elements when they have fully moved against each other and the beams are fully flattened against the underlying substrates;

FIG. 15A shows a side view of an embodiment, a curved conductive element attached to a substrate;

FIG. 15B illustrates the curved conductive element's properties in FIG. 15A when a force F1 is applied;

DETAILED DESCRIPTION

Figure 1:
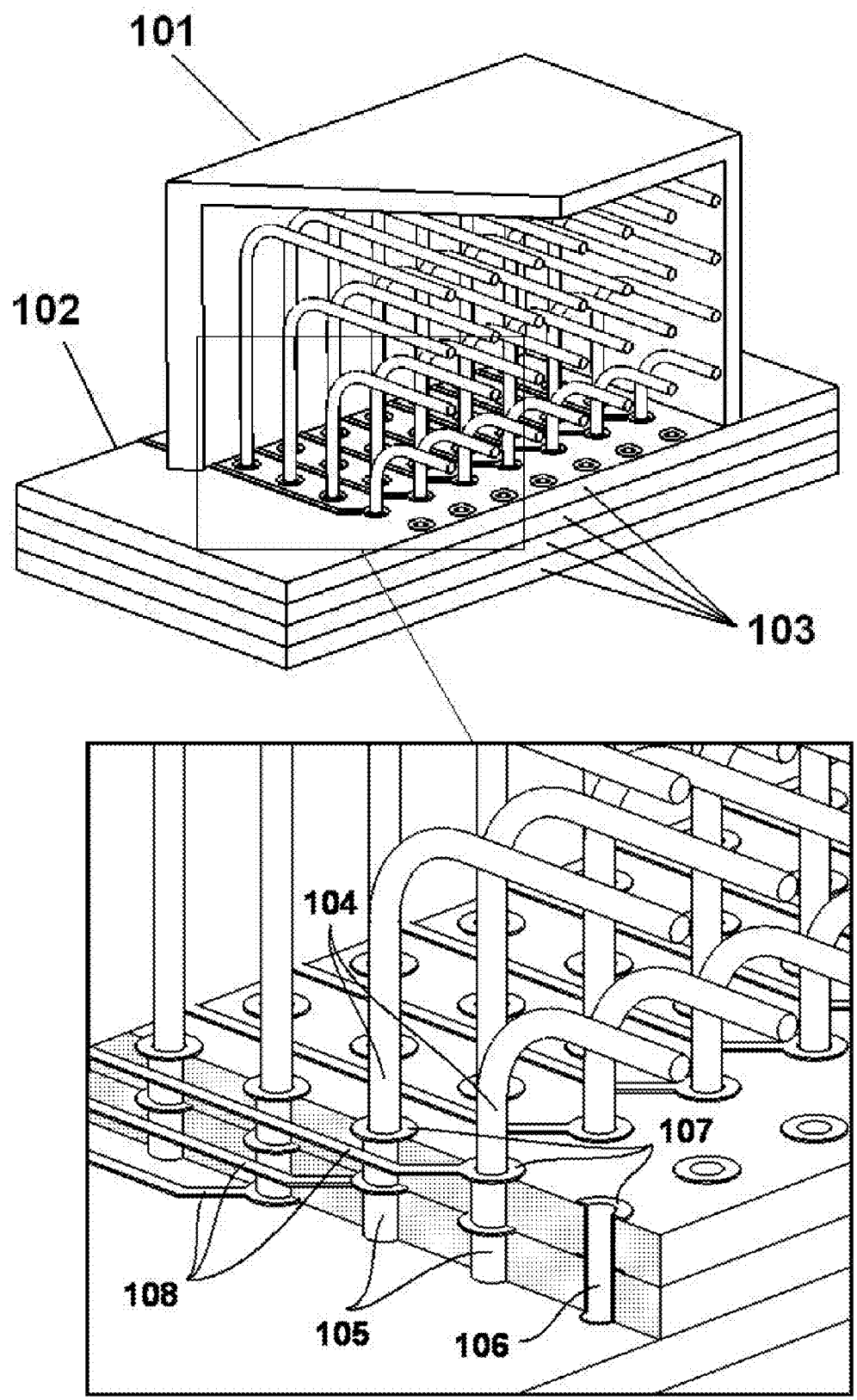
FIG. 1 illustrates a fundamental prior art structure for use in constructing electrical connectors and assembling them to printed circuit boards using a plated through hole.
Figure 2:
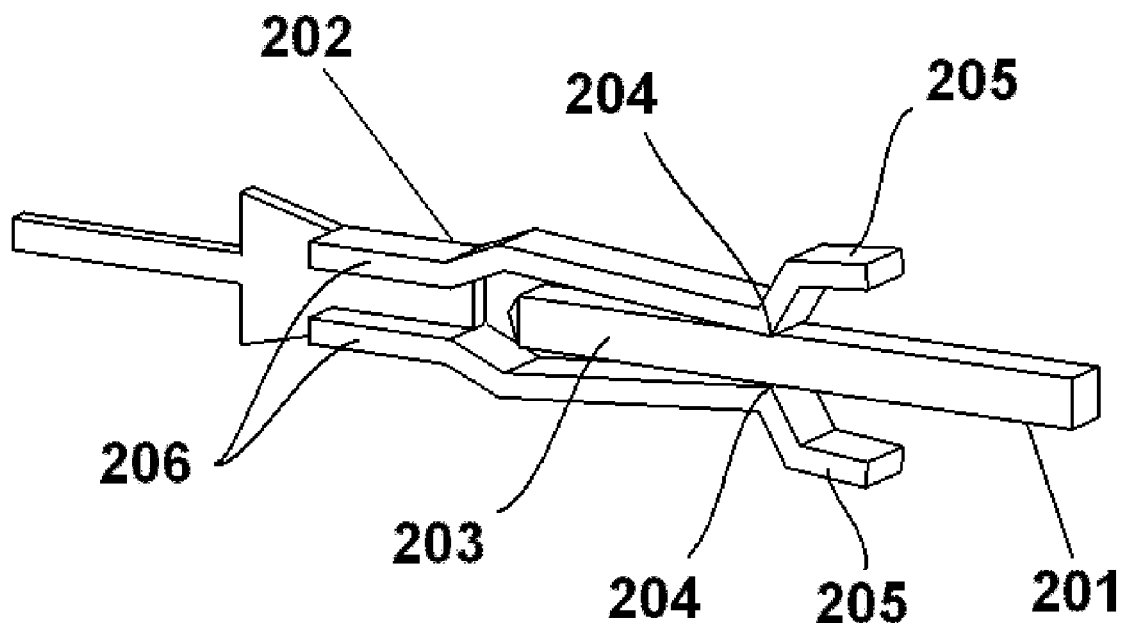
FIG. 2 illustrates a prior art electrical connector in which a post is inserted into a tuning fork type receptacle.
Figure 2A:
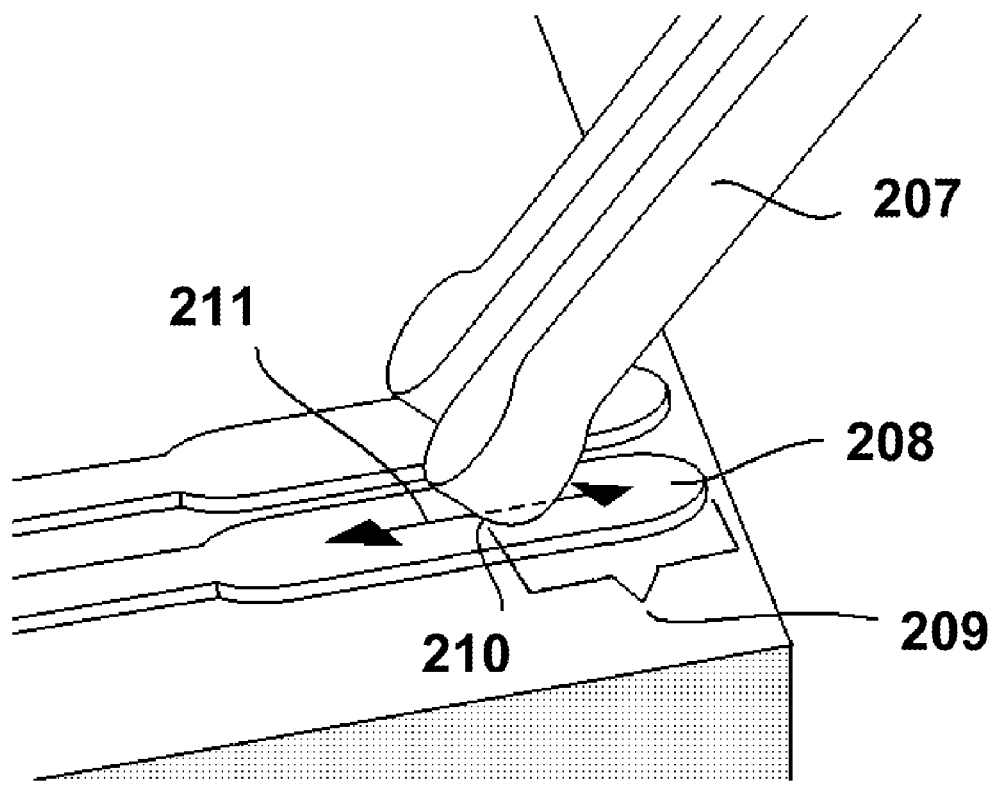
FIG. 2A illustrates a prior art electrical connector in which the electrical contact between a conductive element and a contact pad creates a capacitive stub.

Embodiments of the invention disclosed herein include structures and methods for making three dimensional interconnections between electrical components. An electrical signal traversing the device will encounter only electrically-mated, conductive elements that have no capacitive stubs or capacitive stubs so small as to be negligible in relation to the circuit.

In the following description and in the accompanying drawings, specific terminology and drawing symbols are set forth to provide a thorough understanding of the embodiments. In some instances, the terminology and symbols may imply specific details that are not required to practice embodiments of the invention. In the description of any embodiment, when the term electrical component is used, it may include but not be limited to, printed circuit boards, connectors, cable ends, flexible circuit ends, ceramic or silicon substrates, hybrid circuits, integrated circuits, integrated circuit packages, electrical interposers, or a combination of them. Any of the aforementioned items may be substituted for any other aforementioned item. As an example, the term printed circuit board may be interchanged with electrical component or flexible circuit. Printed circuit boards may be called PCBs or can be subcategorized as backplanes, mother boards, daughter boards, line cards, or daughter cards. In any embodiment of the invention, electrical components may be shown or described at a 90 or 180 degree angle to each other, but unless specifically stated otherwise can be at any other angle.

The references to stair step electrical components made herein are references to electrical components that have contact surfaces in which conductive planes and electrical signal traces are arranged in a stair step configuration that allows connections to be established with other conductive structures arranged in a stair step configuration. The stair step connection surfaces allow electrical contact to be made without using vias or plated through holes. Vias in electrical components, such as printed circuit boards, are known to be a significant source of signal degradation. Stair step connection structures, and systems that utilize stair step connection structures on one component mated to stair step connectors, limit or eliminate the need for vias. Stair step electrical components described herein refer to, for example, any of the stair step printed circuit board structures disclosed in U.S. patent application Ser. No. 10/990,280 ("Stair Step Printed Circuit Board Structures for High Speed Signal Transmissions"), filed Nov. 15, 2004, which is incorporated in its entirety herein by reference.

A number of the figures herein depict two conductors side by side that comprise a differential signal pair. In any embodiment, the conductors may be any conductive material such as metal-coated plastics, metal, conductive elastomers, conductive plastics or the like. In any embodiment, or in any figure showing a conductor, the conductor may be a differential pair, a single-ended conductor, single conductors, single conductors in microwave and stripline geometries, or a coaxial conductor. In any figure showing a cross sectioned view of embodiments of the invention, the presence of the cross section implies that there are additional conductors behind and/or in front of the visible conductors.

In any figure, although a conductor may appear to be at a specific angle with respect to a printed circuit board's surface, it may be at any angle with respect to a printed circuit board's surface.

Some of the figures show an embodiment that has one conductive element which appears alone in the illustration. An embodiment may include the conductive element alone or arranged in rows or arrays of two or more such conductive elements.

Some of the figures show an embodiment that has one pair of conductive element that mate to create an electrical connection. An embodiment may include one pair of such conductive elements alone or pairs of such conductive elements arranged in rows arrays of two or more such pairs of conductive elements.

In any figure, the conductive elements illustrated are part of electrical circuits. The conductive elements extend beyond the edge of the illustration and connect to wires, traces or other electrical structures not pictured.

Figure 3:
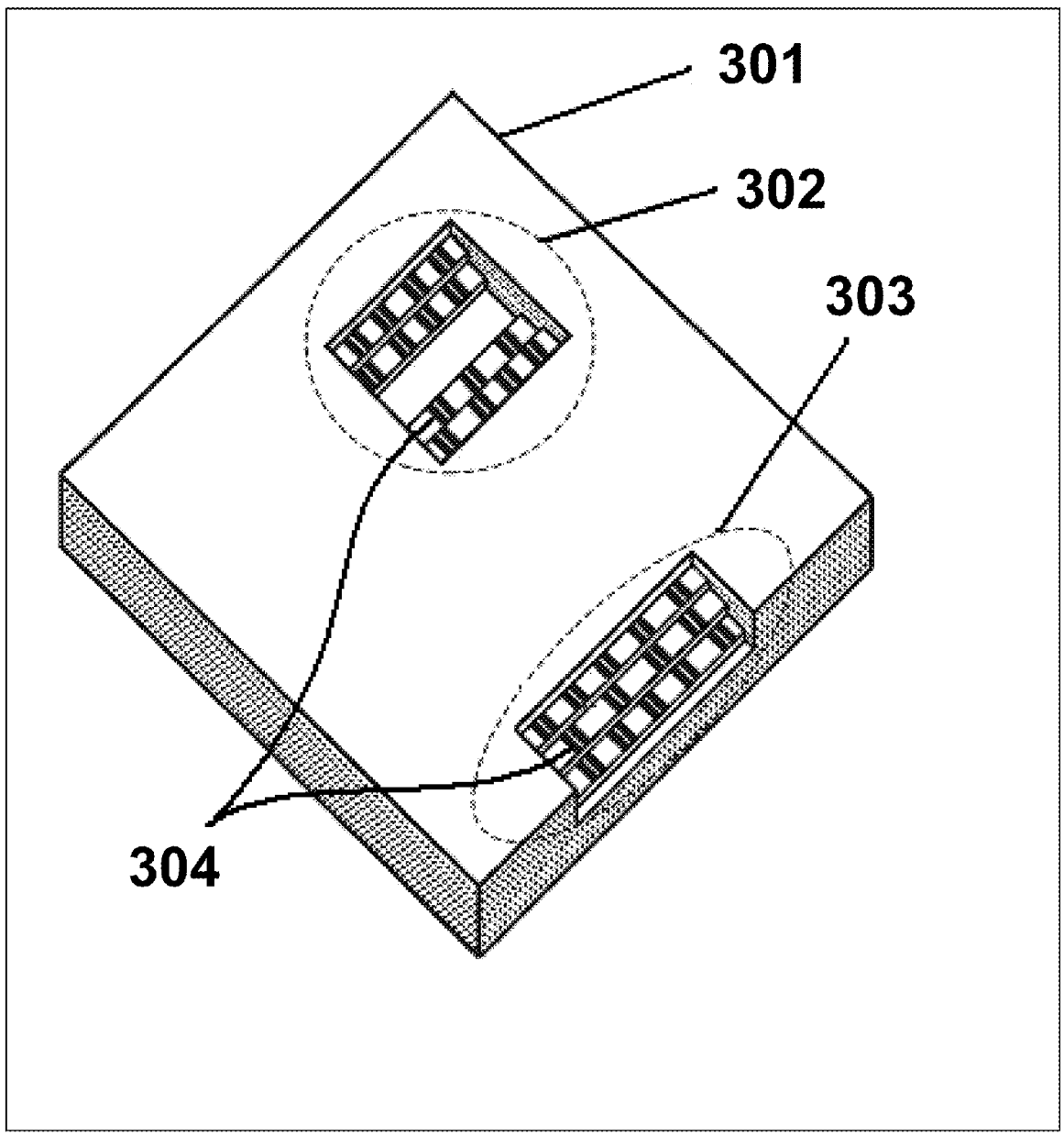
FIG. 3 illustrates a printed circuit board having a stair step structure to which embodiments of the invention can connect.
Figure 3A:
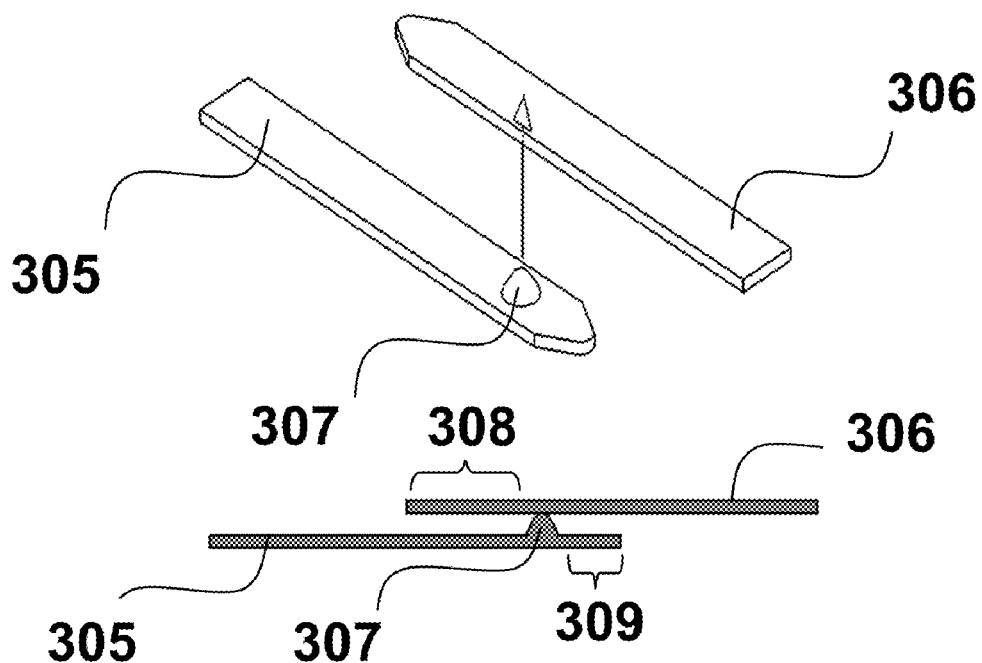
FIG. 3A illustrates a prior art electrical connector in which a narrow flat conductive element with a protrusion is mated with a narrow flat conductive element.

FIG. 3 illustrates prior art stair step electrical component structures, which exposes traces that run one or more layers within a multilayer electrical component, such as a printed circuit board. The stair step structure provides a surface for establishing a point of connection with such traces without the use of plated through holes, also known as a vias, which cause signal degradation. In FIG. 3, signal traces 304 that run in layers below the surface of the electrical component 301 are exposed by the stair step structure 302, 303 in which layers of the electrical component above the signal trace are removed. The signal traces may be exposed by a stair step structure 303 at the edge of the electrical component or by a stair step structure disposed in a well 302 away from the edge of the electrical component. One or more electrical components that incorporate stair step structures may require stair step electrical connectors to establish electromechanical connections between electrical components. The invention includes embodiments that function with stair step structures.

In any figure, a planar surface with electrical contact points may be interchanged with a surface configured as a stair step. In any figure in which a conductive element is illustrated on a planar surface, the planar surface may be one plane among two or more planar surfaces on the electrical component, which planar surfaces are arranged in a stair step configuration.

In any figure, a specific number of layers comprised of dielectric sheets, rows of conductors or conductive planes may be illustrated, but this does not limit the number of layers that could be present in embodiments of the invention.

Figure 4:
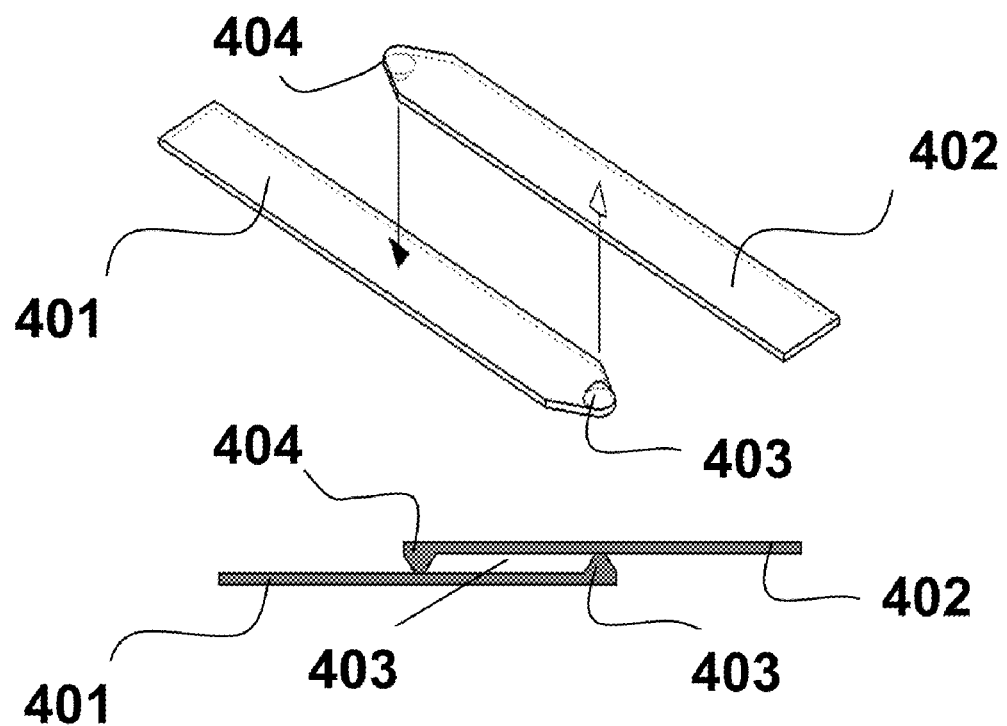
FIG. 4 illustrates an embodiment comprising two conductive elements, each conductive element with a conductive structure at its end disposed to make contact with the body of the counterpart conductive element.

FIG. 4 is an isometric view and a oblique side view of an embodiment comprising a pair of conductive elements 401, 402, shown in their unmated state in the isometric view and in their mated state in the oblique view. In the embodiment, each conductive element 401, 402, has a conductive structure 403, 404 at its end disposed to make contact with the body of the counterpart conductive element when the two conductive elements are brought together. In the mated state, a space 403 between the conductive structures 404, 403 exists where the conductive elements 401, 402 are not in contact.

Figure 5:
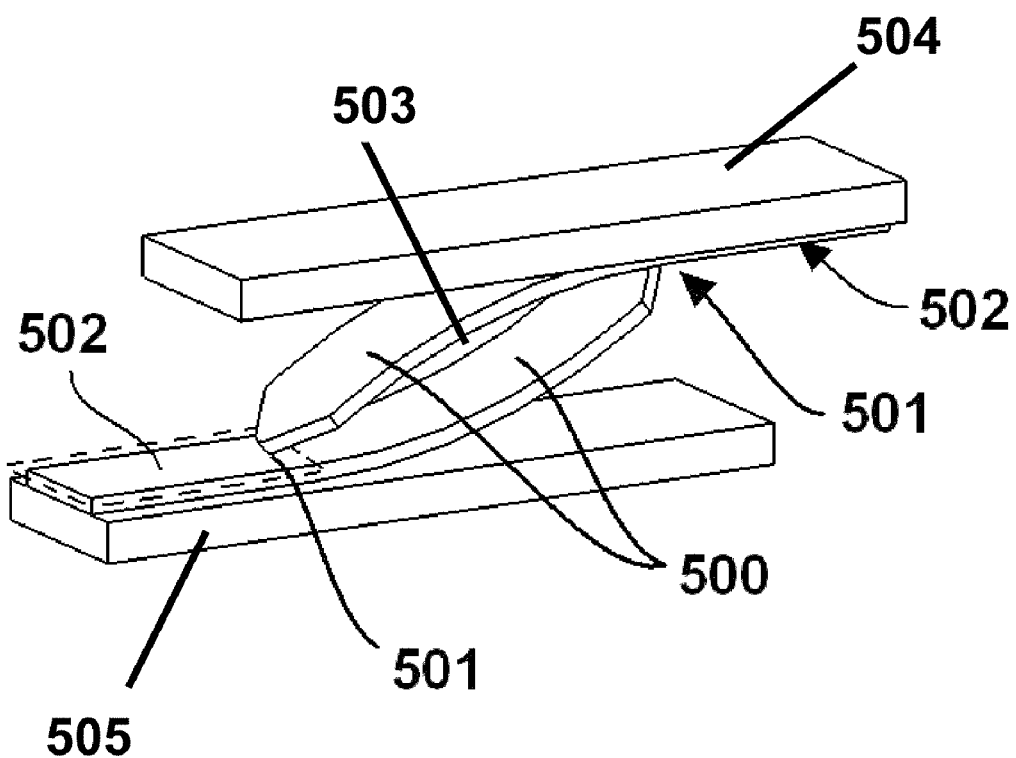
FIG. 5 illustrates an embodiment comprising two conductive elements mounted to a non-flexible structure, the end of each conductive element being comprised of a curved resilient conductive structure.

FIG. 5 is an isometric view of an embodiment comprising two counterpart conductive elements 500 that are to be mated to establish an electrical connection. Each of the counterpart conductive elements 500 is mounted to a counterpart non-flexible structure 504, 505. The connective elements have curved resilient ends aligned to contact the landing zones 502 of their counterpart conductive elements as the non-flexible structures 504, 505 are brought together. As the non-flexible structures are drawn together, the tips 501 of each conductive element 500 make contact with the landing zone 502 of the counterpart conductive element, leaving a space 503 between the points where each tip 501 touches its counterpart landing area. The closer together non-conductive structures 504 and 505 are drawn after initial contact between counterpart conductive elements 500, the further along the landing zones 502 the tips will move, resulting in contact wipe.

Figure 6:
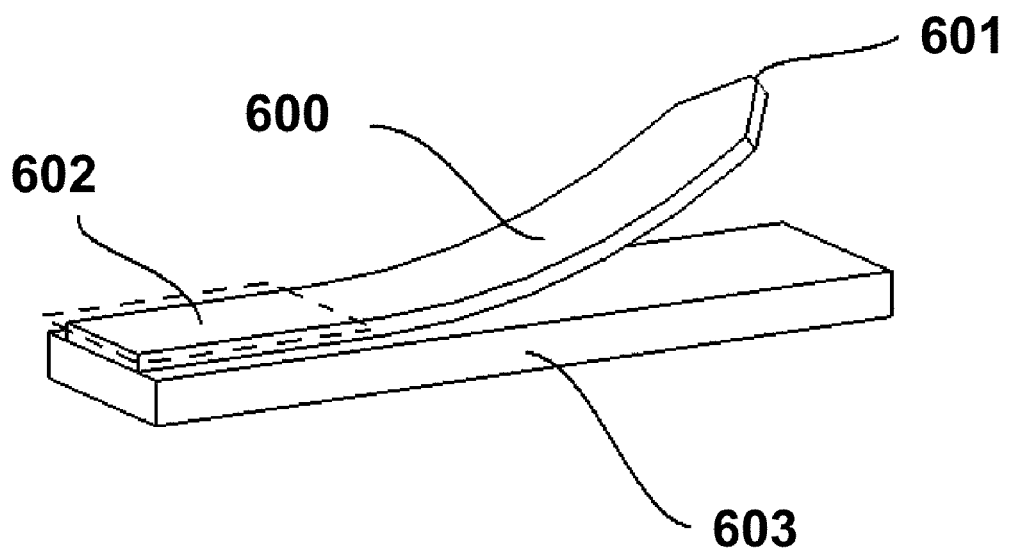
FIG. 6 illustrates an embodiment, in which a conductive element is mounted to a non-flexible structure and has a curved flexible end that is disposed to connect to the body of a counterpart conductive element.

FIG. 6 is an isometric view of an embodiment comprising a conductive element with a landing zone 602, a curved resilient section 600, and a tip 601 disposed so that the tip will make contact with a contact zone of a counterpart conductive element. The non-curved portion of the conductive element is connected to a non-flexible structure 603, which may include but is not limited to a substrate. The tip of the counterpart conductive element will make contact with the landing zone 602 so that when mated, the tip 601 will be touching the landing zone of the counterpart conductive element and the tip of the counterpart conductive element will be touching the landing zone 602, creating two points of contact between the embodiment and the counterpart conductive element and a space where no contact exists. As the counterpart conductive elements are brought together, the contact points migrate, causing contact wipe.

Figure 7:
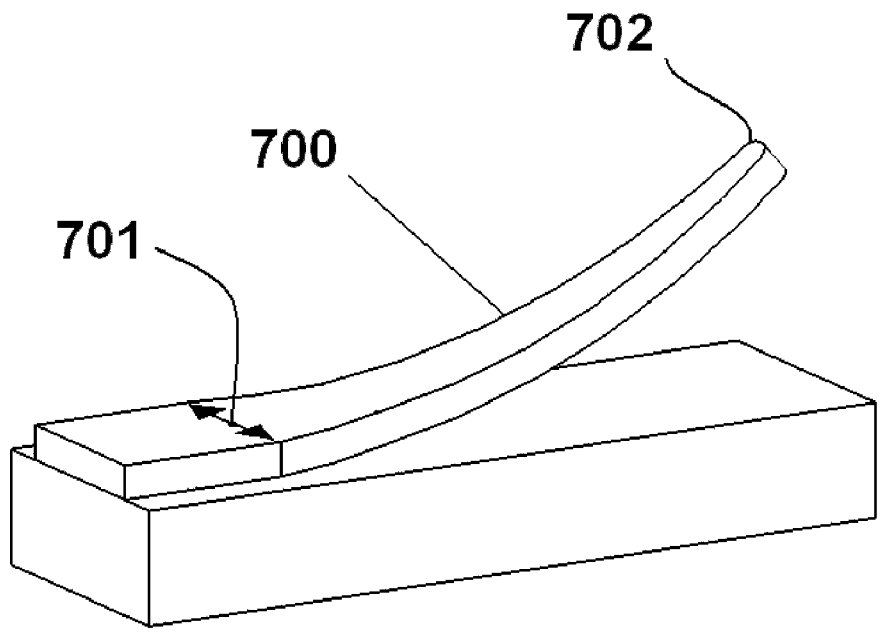
FIG. 7 illustrates an embodiment incorporating a curved conductive element that is tapered from the attachment area to the electrical contact point.

FIG. 7 is another embodiment of the interconnection device in FIG. 6, showing a curved resilient end 700 to the conductive element. The curved resilient end incorporates a more gradual taper starting at the width 701 and tapering down in size as the contact zone 702 is approached. The taper can also vary in thickness in addition to width. The taper is included so that the stresses are more uniformly distributed over the length of the conductive element. This lowers the maximum stress level to diminish cyclic fatigue or permanent distortion.

Figure 8:
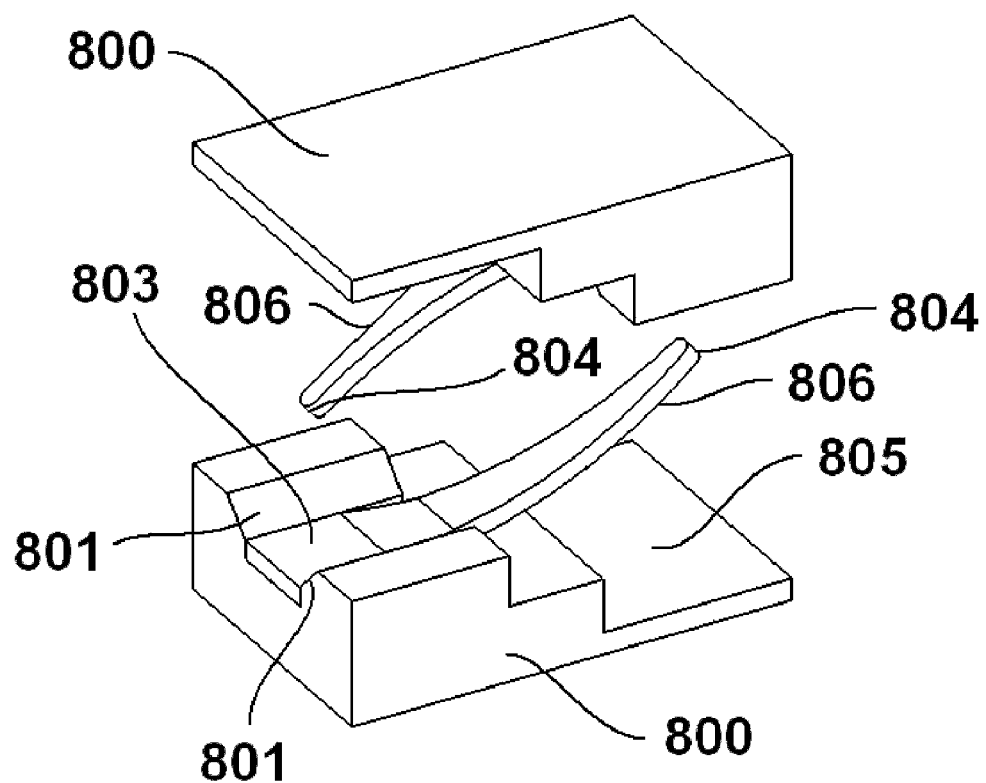
FIG. 8 illustrates an embodiment incorporating two tapered curved conductive elements surrounded by angled walls at their attachment point and cavities for accommodating the angled walls on the opposing like assembly.

FIG. 8 illustrates an underlying structure 800 configured with angled walls 801 on either side of the landing zone 803 on the conductive element 806. The angled walls 801 guide the counterpart conductive element's tip 804 onto the electrical contact area 803 to promote alignment. The substrate includes a step 805 that accommodates the angled walls on the opposing substrate. The structures nest together allowing the conductive elements to bend flat or substantially flat to promote complete mating.

Figure 9:
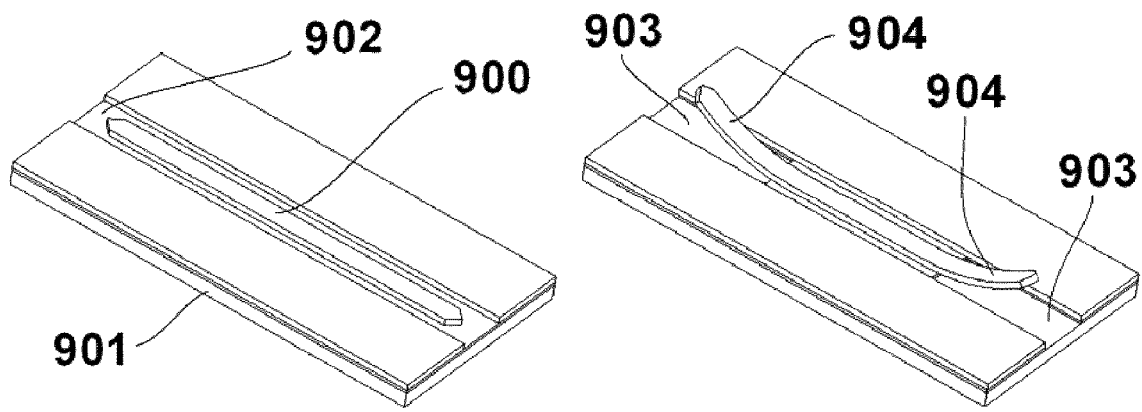
FIG. 9 illustrates an embodiment of a signal trace that is etched from conductive sheet material with adhesive film removed from beneath the trace's end portions and the ends curved upward to create curved conductive elements.

FIG. 9 illustrates an embodiment wherein a conductive signal trace 900 may be etched, stamped or otherwise constructed from a spring-like material such as beryllium copper. The spring-like material in sheet form may be adhered, using an adhesive film 902, to a dielectric substrate 901 such as polyimide. At one end or at either end of the conductive signal trace 900, a portion of the trace may be released from the underlying dielectric substrate 901 by etching or removing an appropriate area 903 of adhesive layer 902. The released portion of the trace can be bent by various methods into the required shape of a conductive element 904 and having the same properties of conductive element 500. from FIG. 5

Figure 10:
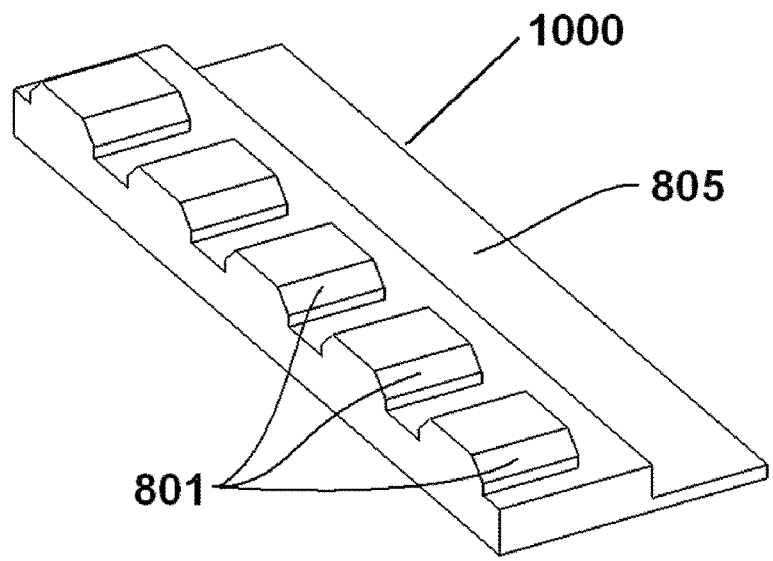
FIG. 10 illustrates the substrate disposed under an array of the curved conductive elements in FIG. 8 that incorporates angled walls and the corresponding cavity.

FIG. 10 shows the substrate 1000, incorporating rows of angled guide walls.

Figure 11:
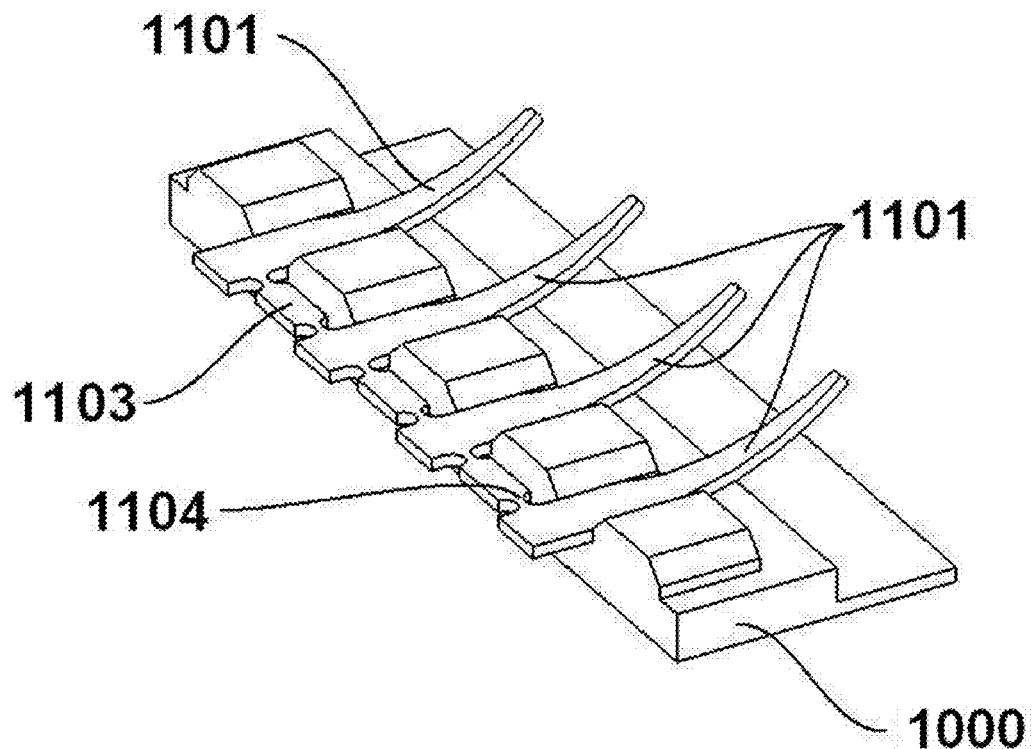
FIG. 11 illustrates an embodiment, multiple curved conductive elements, tied together into one entity by connecting bars, attached to the substrate in FIG. 10.
Figure 12:
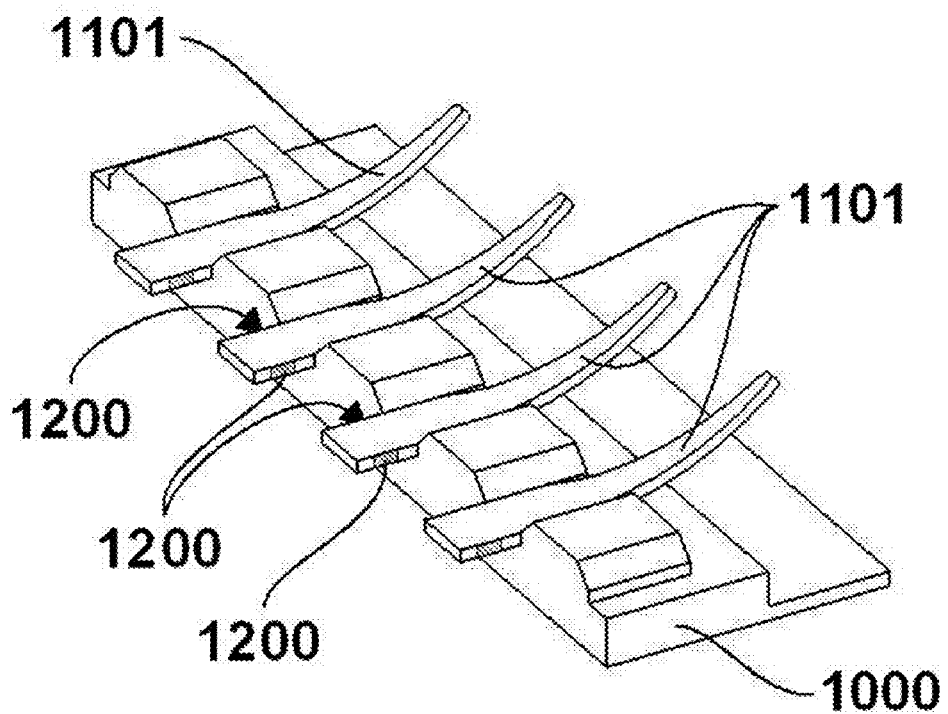
FIG. 12 illustrates the multiple curved conductive elements from FIG. 11 with the connecting bars removed.
Figure 13:
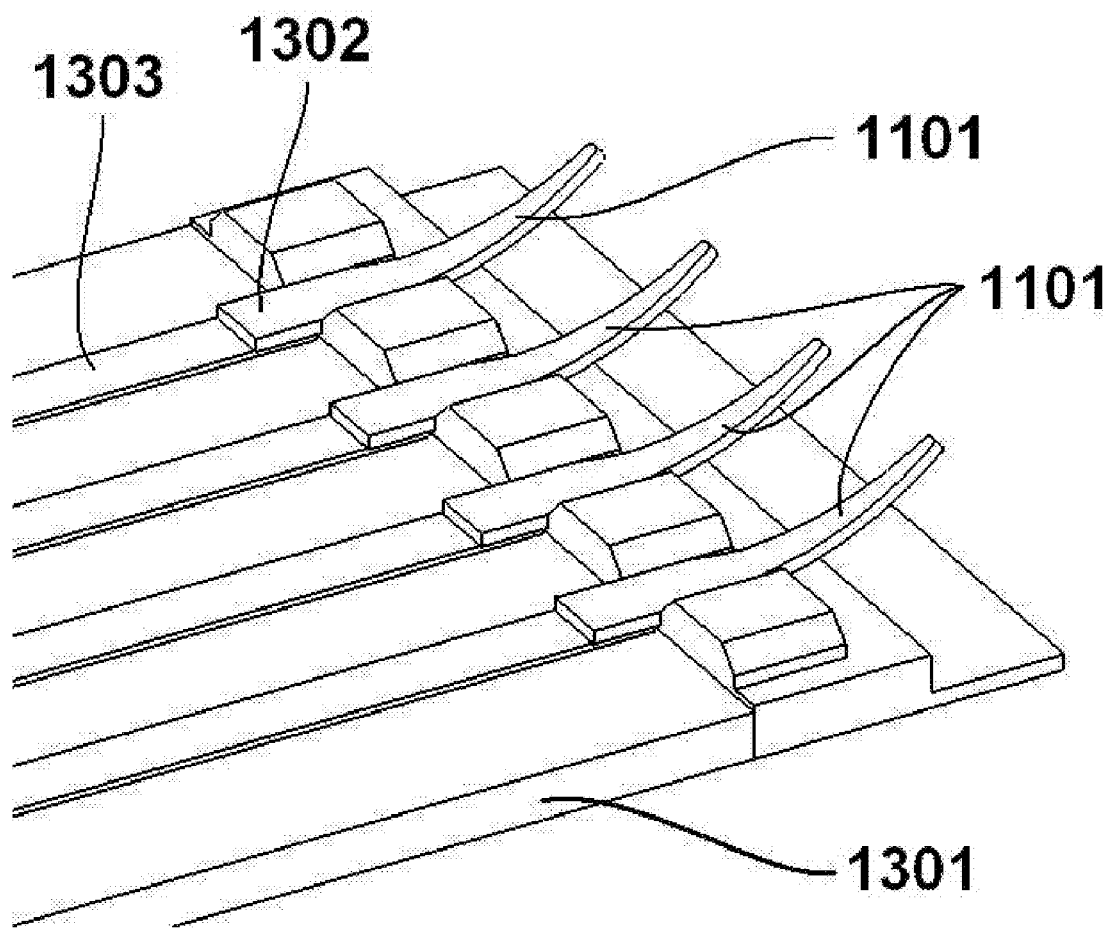
FIG. 13 illustrates the assembly from FIG. 12 assembled to a circuit structure upon which the ends of the curved conductive elements are conductively attached to the conductive signal traces on the circuit structure.

FIG. 11 through 13 shows an assembly incorporating rows of curved tapered resilient conductive elements and angled guide walls. FIG. 11 shows a row of conductive elements 1101 adhered to the underlying substrate with angled guide walls 1000 shown in FIG. 10. There are integral connecting bars 1103 connecting the conductive elements 1101 together. The connecting bars 1103 have narrowed areas that act as breakoff points 1104 so the connecting bars 1103 can be separated from the conductive elements 1101.

FIG. 12 shows the conductive elements 1101 on the substrate 1000 without the connecting bars 1103. The shaded areas 1200 illustrate the surfaces where the connecting bars 1103 have been etched, sheared or broken away from the conductive elements 1101.

FIG. 13 shows the assembly in FIG. 12 placed upon an electrical component 1301 that includes traces 1303, to which the curved resilient conductive elements 1101 attach. The base 1302 of each conductive element aligns and makes contact with signal traces 1303 on the circuit structure. The signal traces 1303 and the conductive elements 1101 are conductively attached to each other by means such as welding, soldering or laser welding, but not limited by such means.

Figure 14A:
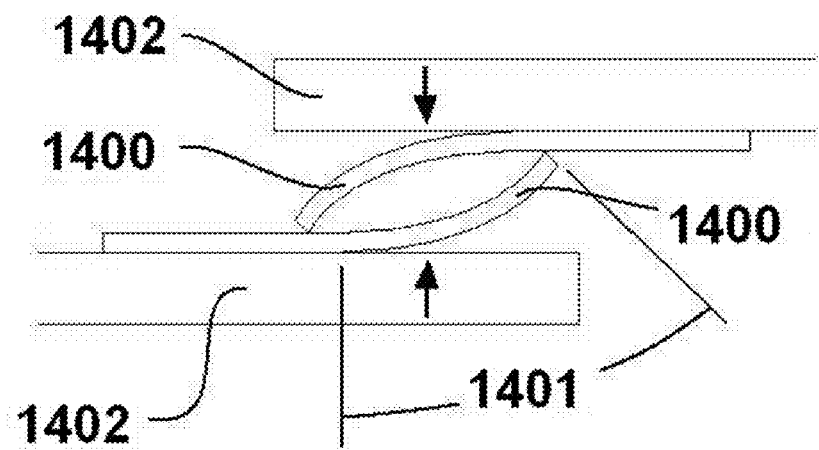
FIG. 14A illustrates a side view of the embodiment, two curved conductive elements from FIG. 5 as they begin to contact each other.

FIGS. 14A through 14C illustrate how the free beam lengths shorten as the conductive elements mate. FIG. 14A shows the embodiment wherein the curved resilient ends of the conductive elements 1400, attached to the underlying non-flexible structures 1402, are beginning to touch. The free beam lengths 1401 are at a maximum. The arrows show the direction of movement of the opposing non-flexible structures 1402, to which the counterpart conductive elements 1400 are attached. FIG. 14B shows the non-flexible structures 1402 moving toward each other and the counterpart conductive elements 1400 partially flattening. The free beam lengths 1403 are at an intermediate length. FIG. 14C shows the conductive elements 1400 when they are fully mated. The conductive elements 1400 have been substantially flattened against their respective underlying substrates 1402. The free beam lengths 1404 are at a minimum.

Figure 15C:
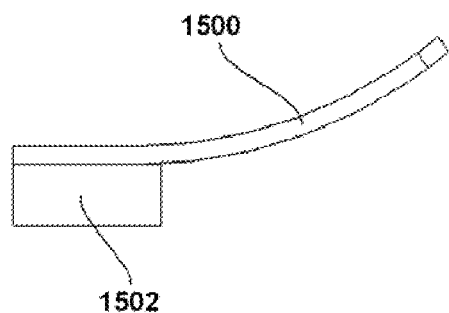
FIG. 15C shows the curved conductive element in FIG. 15A except that a portion of the substrate is removed.
Figure 15D:
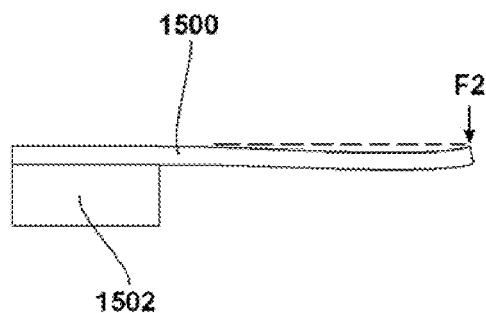
FIG. 15D illustrates the curved conductive element's properties in FIG. 15C when a force F2 is applied.

The action described in the previous paragraph results in two properties, which will be explained in FIGS. 15A through 15C. The contact forces of two different conductive element configurations will be compared to each other to show that the contact forces created are unequal. In FIG. 15A, the first configuration is of a conductive element 1500 on an underlying substrate 1501 shown with no force applied to the tip via contact with a counterpart conductive element. In FIG. 15B, contact force F1 is applied to the tip. In FIG. 15C, the second configuration has the same conductive element 1500 except that the underlying non-flexible structure 1502 is absent under the free portion of the conductive element 1500. FIG. 15D illustrates the conductive element 1500 with a contact force F2 applied to the tip. It shows the same amount of deflection as in FIG. 15B. The first property is that the contact force F1 is greater than contact force F2 because the free beam length of the conductive element 1500 in FIGS. 15A, 15B shortens when mating occurs as was explained in FIGS. 14A through 14C. The second property is that the stresses are distributed more uniformly over the conductive element's length in FIGS. 15A, 15B effectively lowering the maximum stresses. Thus, for the same spring properties, shape and size, the conductive element in FIGS. 15A, 15B has greater electrical contact reliability and is less susceptible to cyclic fatigue and permanent deformation than the conductive element in FIGS. 15C, 15D because of the presence of the underlying substrate 1501.

Figure 16:
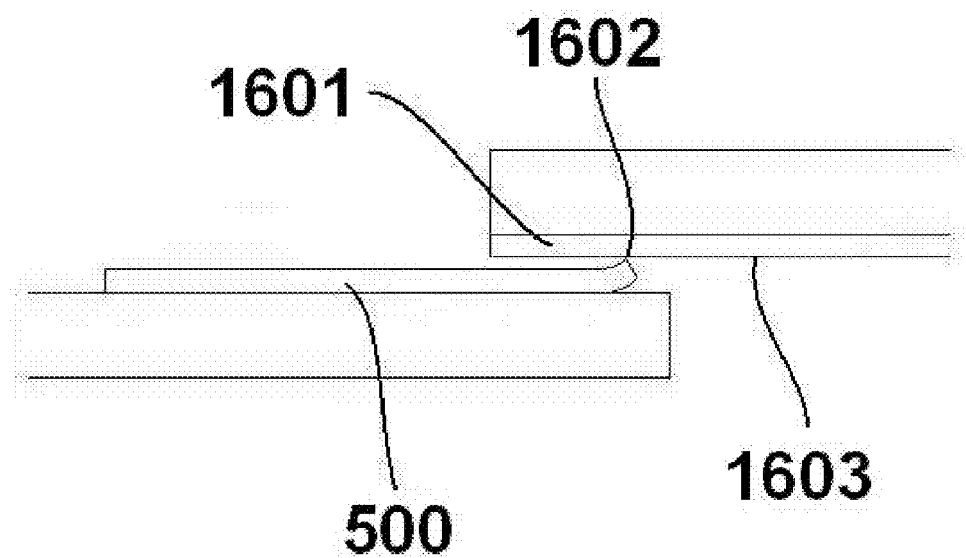
FIG. 16 illustrates how the absence of one of the curved conductive elements, which has been replaced by a conductive pad, creates a capacitive stub.

FIG. 16 illustrates how a capacitive stub 1601 is created to the left of the electrical contact point 1602 when there is a conductive element 500 on one object and an electrical contact area 1603 on the other object.

Figure 17:
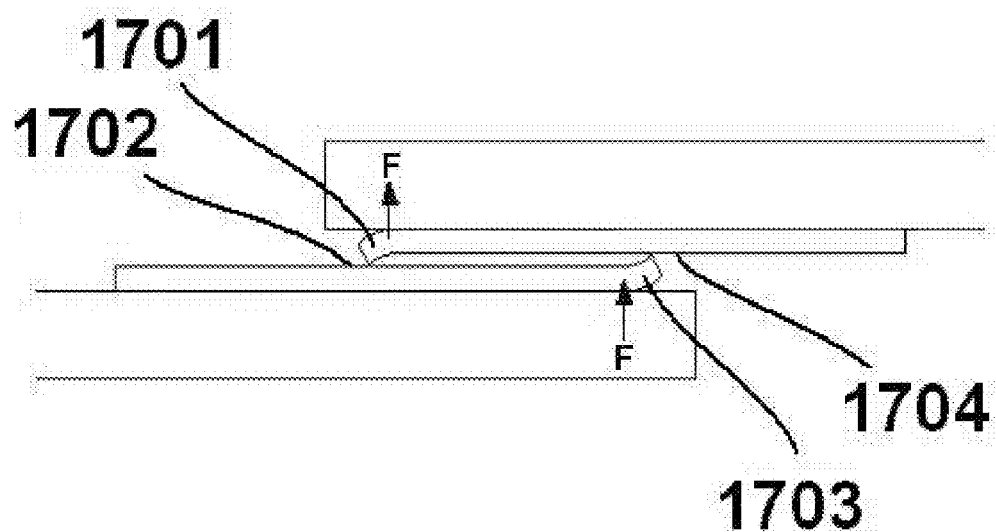
FIG. 17 illustrates an embodiment wherein shock forces (F) affect the electrical continuity through the curved conductive elements.

FIG. 17 illustrates a third property of the embodiment that is its increased capability to withstand mechanical shock that may cause the conductive elements' electrical contact points to lift off its electrical contact area thus causing signal interruption. The same shock force F attempts to lift the top electrical contact point 1701 off the bottom electrical contact area 1702, but the same shock force F presses the bottom electrical contact point 1703 into the top electrical contact area 1704 insuring that there is always electrical continuity.

Figure 18:
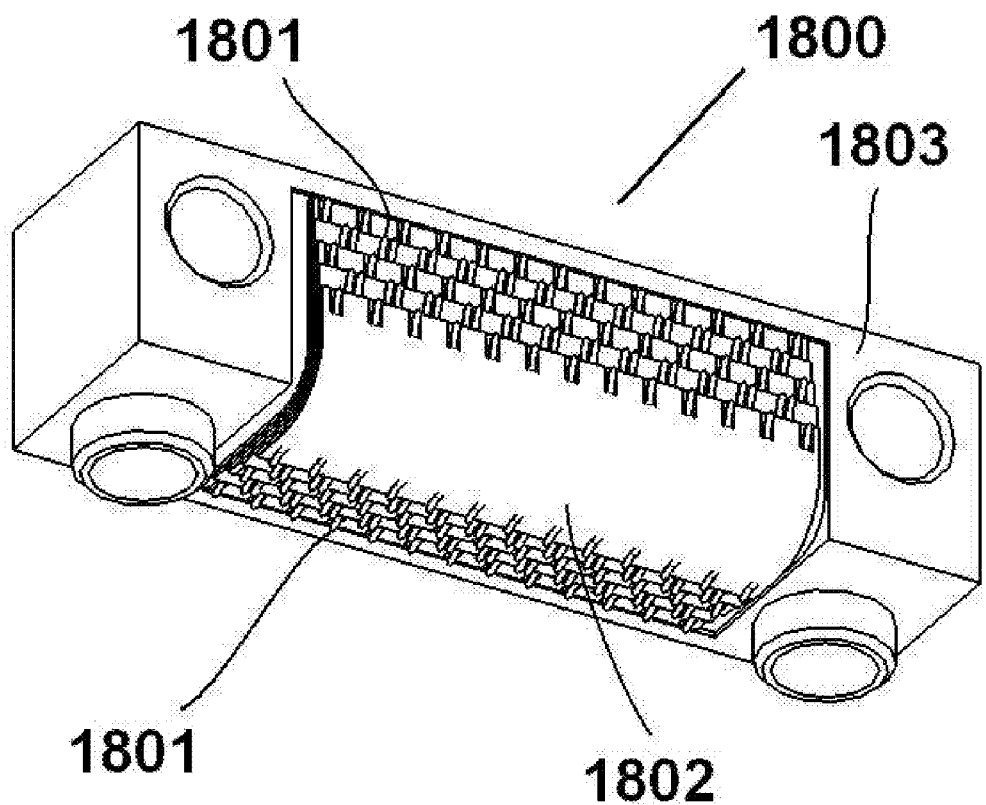
FIG. 18 illustrates an embodiment, an electrical connector using the curved conductive elements in a multiple-layered flexible circuit that is disposed at 90 degrees.
Figure 19:
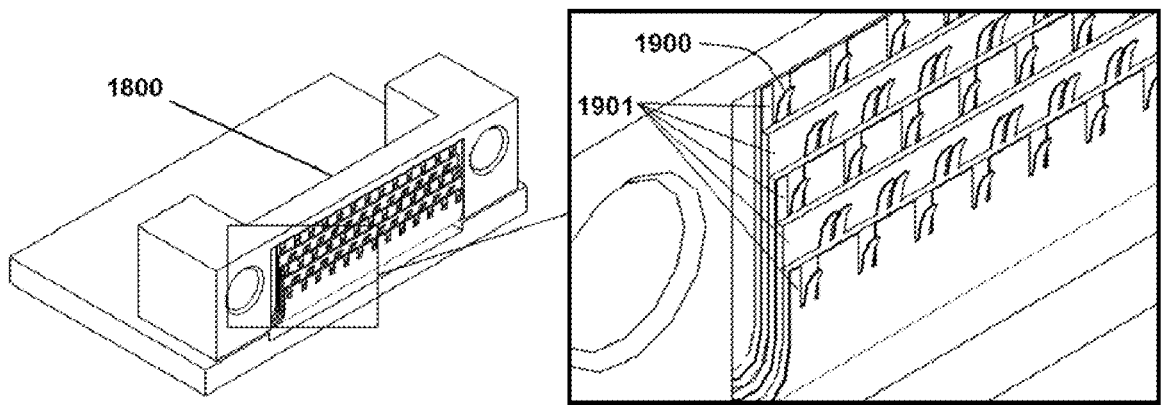
FIG. 19 illustrates a close up of the embodiment, curved conductive elements comprising ground, differential signal, ground, differential signal, and ground rows in FIG. 18.

FIG. 18 illustrates how the conductive elements 1801 are integrated into an electrical connector 1800 whose conductive entities or signal traces interconnect two printed circuit boards (not shown) disposed at 90 degrees or at any other angles to each other. The conductive entities or signal traces may be etched into flexible circuit layers 1802, formed and assembled onto a connector body 1803 or they may be manufactured by any suitable method. FIG. 19 is a closeup of an electrical connector 1800, mounted on an electrical component, showing the conductive elements 1900 and the stair step nature 1901 of the rows of conductive elements.

Figure 20:
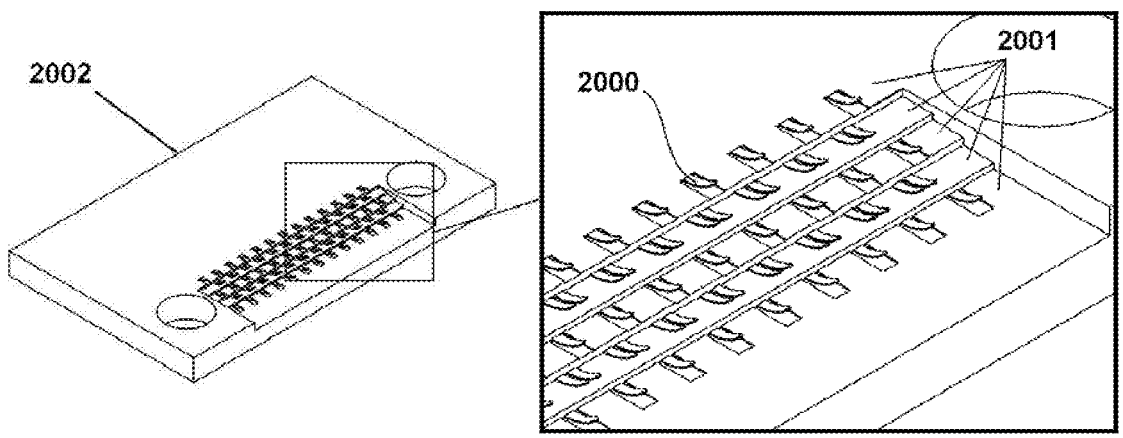
FIG. 20 illustrates an embodiment, curved conductive elements on the mating electrical component, in this case, a printed circuit board.

FIG. 20 illustrates the printed circuit board 2002 that mates with electrical connector 1800. The closeup shows the rows of conductive elements 2000 arrayed on the stair step surfaces 2001 of the printed circuit board.

Alignment features insure that the electrical contact points on the conductive elements align with the electrical contact areas on the mating part. For example, the alignment features may be a protruding object on a mating part that drops into a closely fitting cavity on the opposing mating part. The conductive elements may be aligned with many other existing alignment methods.

Figure 21:
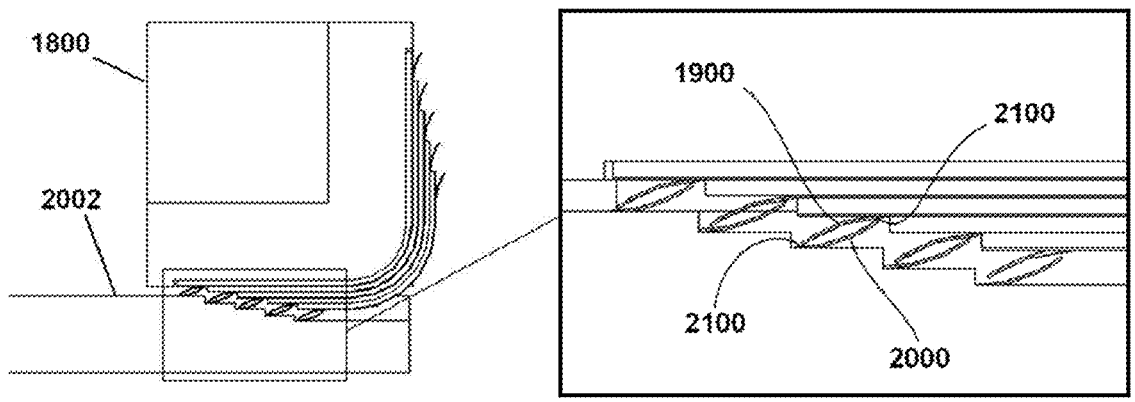
FIG. 21 illustrates a cross section through the embodiment, the electrical connector and printed circuit board shown in FIGS. 19 and 20 respectively just as the electrical contacts come together.

FIG. 21 illustrates a closeup of a cross section of the electrical connector 1800 as the electrical contact points of its conductive elements 1900 begin to touch the electrical contact areas 2100 of conductive elements 2000 on the printed circuit board 2002.

Figure 22:
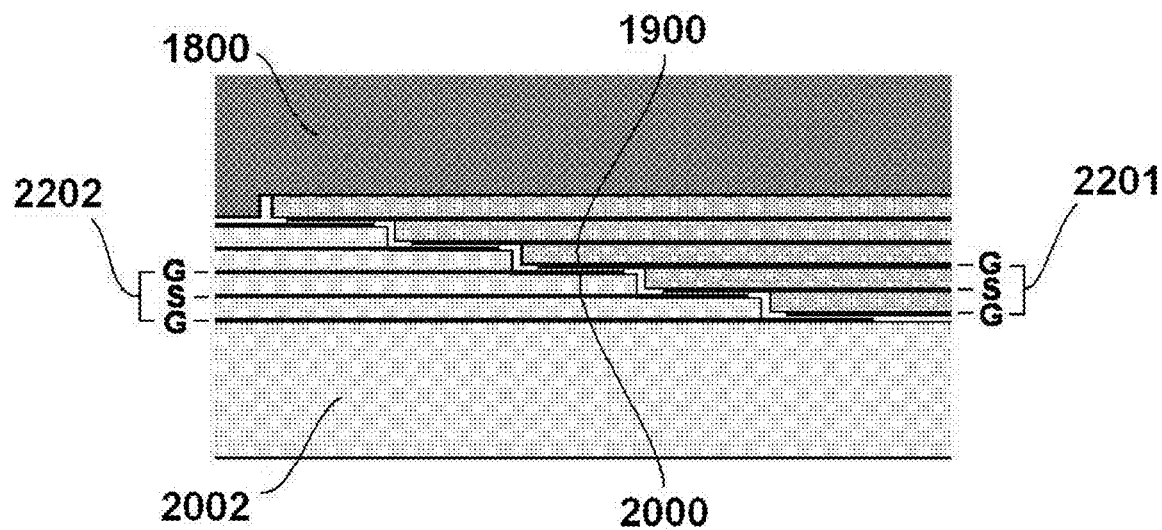
FIG. 22 illustrates an embodiment where the electromechanical connections are made on surfaces of electrical components arranged in a stairstep manner.

FIG. 22 shows a close-up of the electrical contacts of the conductive elements 1900, 2000 when the electrical connector 1800 is completely mated to the printed circuit board 2002 and the conductive elements are completely flattened. FIG. 22 illustrates how the dimensions in the electrical connector's stripline, which is a transmission line structure 2201 can be made equivalent to the dimensions in the printed circuit board's stripline 2202 especially if the relative dielectric constants are kept the same or very similar within the electrical connector and the printed circuit board. The groundplanes (denoted by the letter "G") and signal conductive entities (denoted by the letter "S") in the electrical connector are parallel to the corresponding groundplanes and signal conductive entities in the printed circuit board's stripline. A high-speed, digital signal would see a stripline structure at the electrical contact interface with very little of the physical discontinuities that create signal integrity disruptions.

Figure 23:
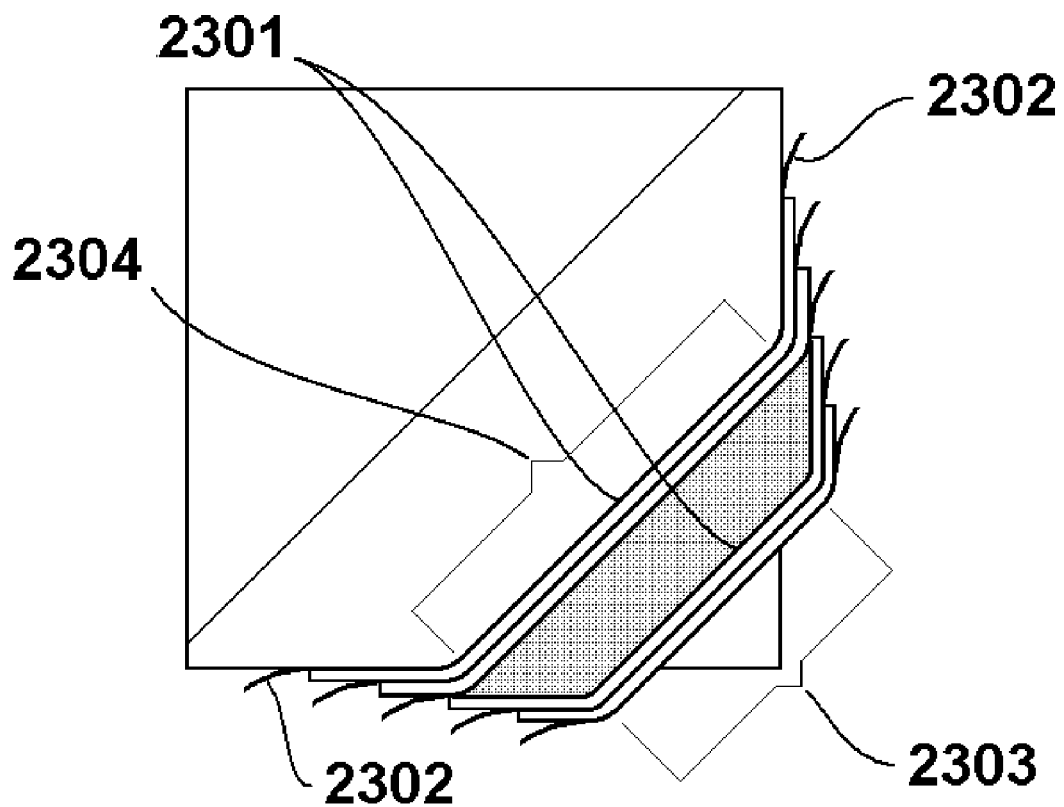
FIG. 23 illustrates a cross section through an embodiment, an electrical connector composed of rows of conductors in multiple layers that have the centers of its conductors disposed at an angle to allow the signals to have the shortest path through the electrical connector between electrical components arranged at an angle to each other.

FIG. 23 illustrates how the conductors 2301 connecting the conductive elements 2302 can have a shorter signal path 2303, 2304 in contrast to the signal path illustrated in FIG. 21.

Figure 24:
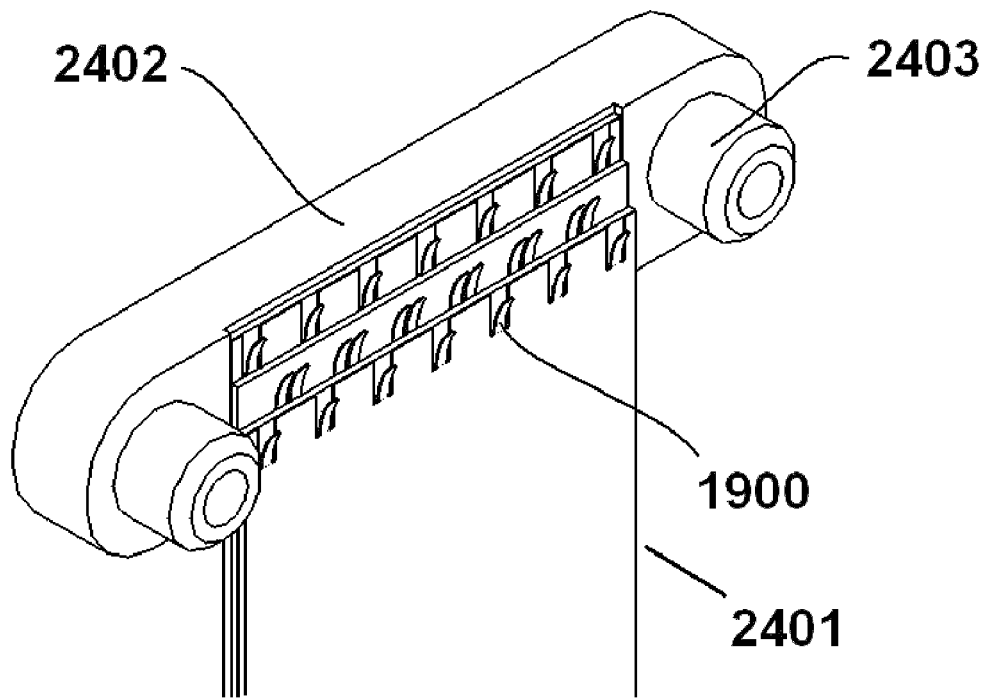
FIG. 24 illustrates an embodiment, in which curved conductive elements are disposed at the end of a flexible circuit with a clamp at the end of the circuit providing contact force.

FIG. 24 illustrates an embodiment, a flexible circuit cable 2401 using the conductive elements 1900 arrayed in rows disposed on different surfaces of a flexible circuit with a stair step shape. The flexible circuit cable 2401 has a clamping plate 2402 to provide the contact force and alignment features 2403, although there are many other methods to create the latter functions.

Figure 25:
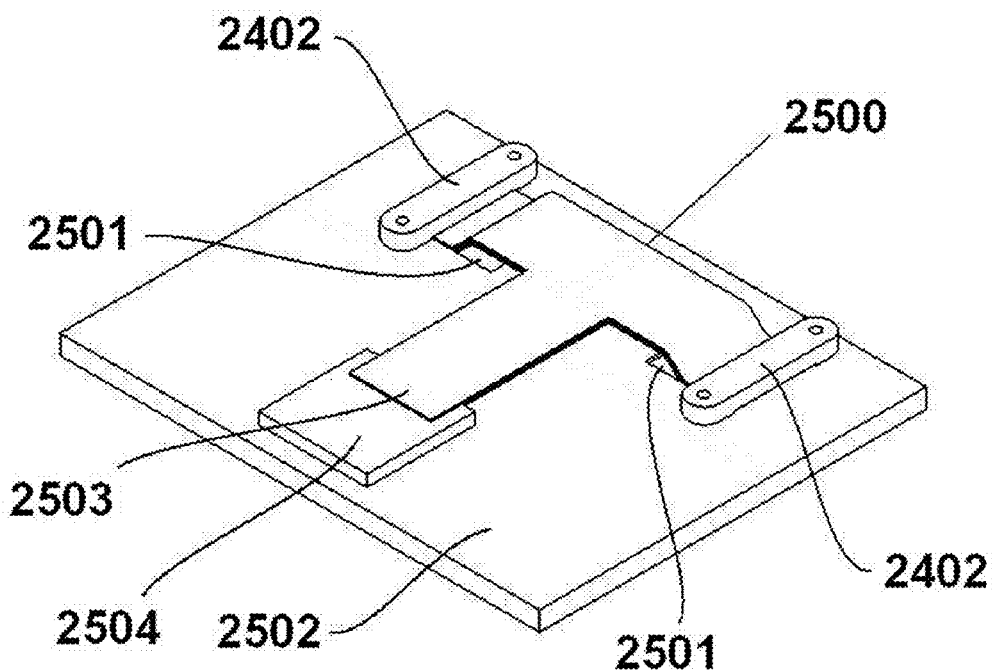
FIG. 25 illustrates an embodiment in a multiple-branched cable, whose ends are configured as in FIG. 24, that is connected to electrical contact surfaces arranged in a stair step configuration on a backplane, as in FIG. 20, that is also connected to an integrated package incorporating the same stair step electrical contact configuration as in FIG. 20.

FIG. 25 illustrates a multiple-branched flexible circuit cable 2500 of the flexible circuit cable type shown in FIG. 24. Two clamping plates 2402 clamp conductive elements arrayed in rows that are disposed on different surfaces of a flexible circuit having a stair step shape at each of two branched ends. The branched ends fit into cavities 2501 in the underlying backplane 2502. An additional cable end 2503 interconnects with conductive elements arrayed in rows disposed on different surfaces of a stair step shape in an IC package or other electronic device 2504.

Figure 26:
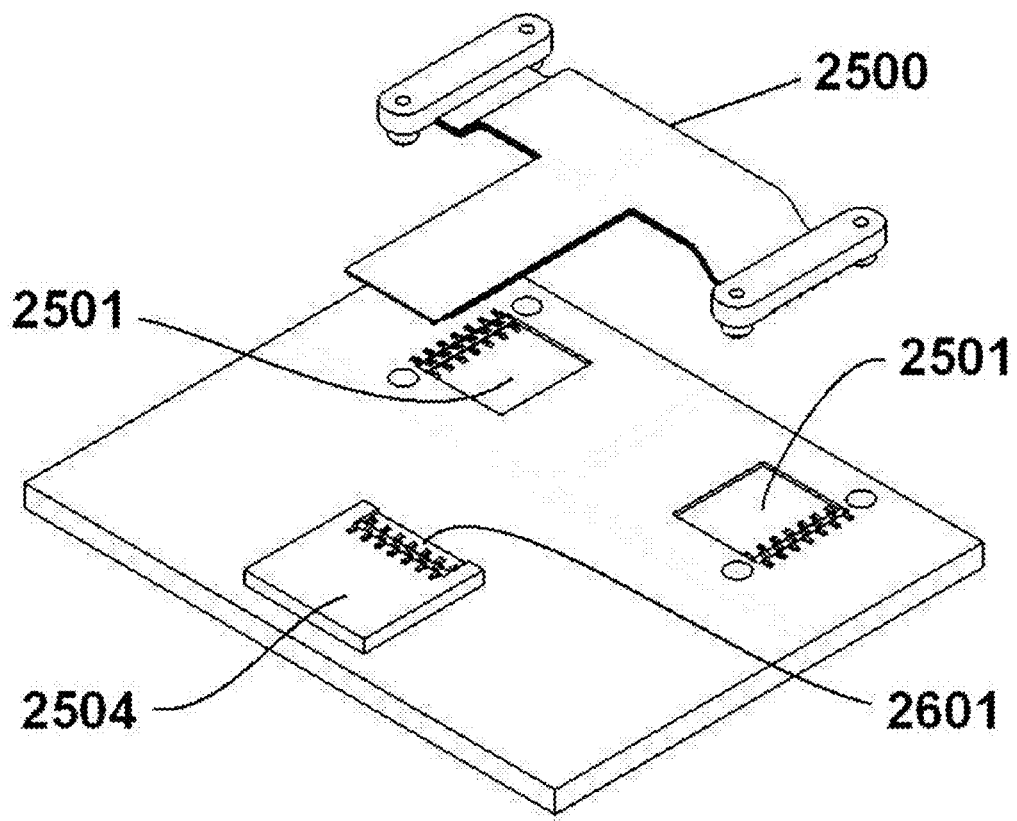
FIG. 26 illustrates an exploded view of the assembly in FIG. 25.

FIG. 26 is an exploded assembly version of FIG. 25 showing the multiply-flexible circuit cable 2500 hovering over the backplane, thus illustrating the conductive elements arrayed on different surfaces of stair step backplane cavities 2501 and on the stair step surface 2601 on the IC package or other electronic device 2504.

Figure 27:
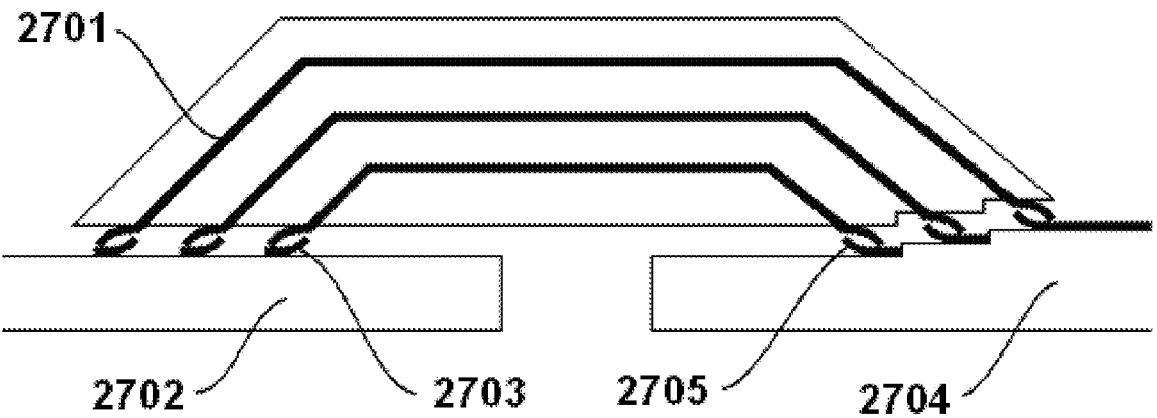
FIG. 27 illustrates an embodiment wherein the electrical components to be connected are disposed at 180 degrees or some other angle to each other and at a distance from each other.

FIG. 27 illustrates an embodiment wherein the printed circuit boards can be disposed at 180 degrees or some other angle to each other and at any distance from each other. The distance between the electrical connector's conductors 4001 are maintained so that the signal integrity and impedance of the transmission line is uniform throughout the electrical connector. The printed circuit board 2702 at the lower left has all the conductive elements 2703 at the printed circuit board's top surface. The printed circuit board 2704 on the lower right has a stair step configuration wherein the rows of conductive elements 2705 are on different stair step surfaces. FIG. 27 illustrates how signal integrity discontinuities are kept to a minimum by eliminating capacitive stubs created by a portion of the electrical contact areas extending beyond the electrical contact points.

Figure 28:
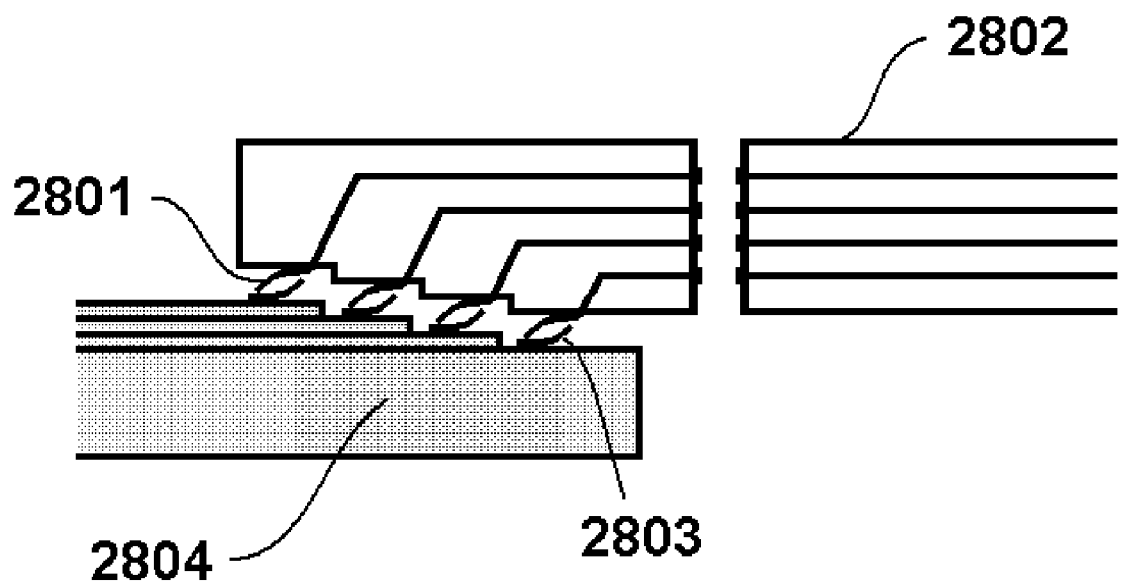
FIG. 28 illustrates an embodiment wherein the curved conductive elements are an extension of a flexible circuit's etched signal traces, cable wires or conductors in a coaxial cable.

FIG. 28 illustrates an embodiment wherein the conductive elements 2801 in an electrical connector are attached to, or are an extension of a flexible circuit's conductive entities such as etched signal traces, wires in a cable or coaxial structures in a coaxial cable 2802. The conductive elements 2801 arrayed on the electrical connector's stair step surfaces mate with conductive elements 2803 arrayed on the stair step surfaces of a printed circuit board 2804.

Figure 29:
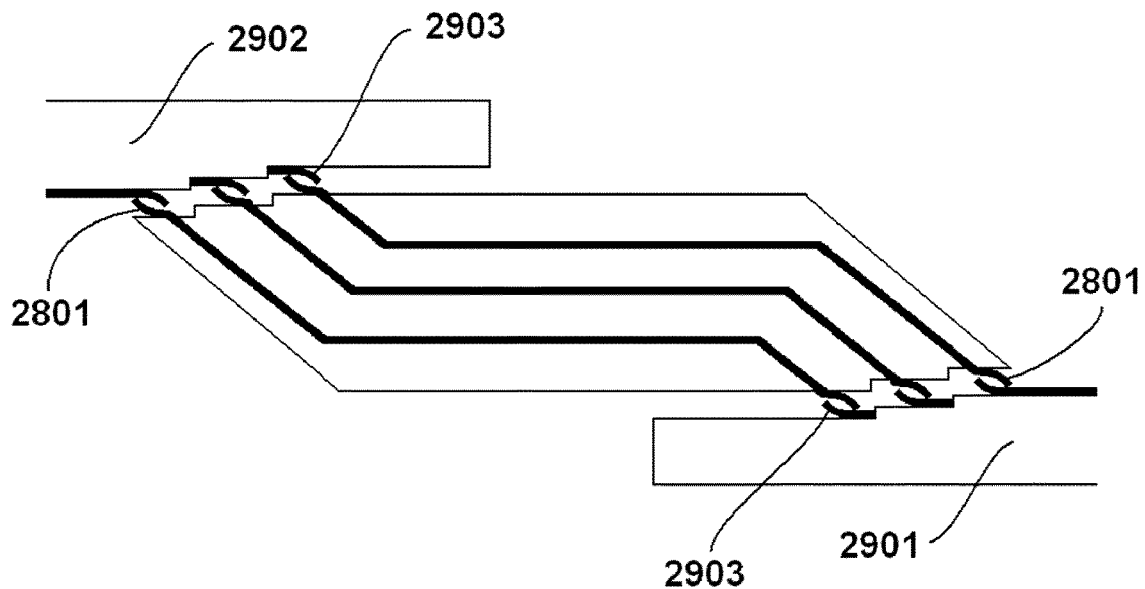
FIG. 29 illustrates an embodiment wherein the curved conductive elements are disposed in a stair step structure so that the electrical components' curved conductive elements are opposite each other.

FIG. 29 illustrates an embodiment wherein the conductive elements 2801 in the electrical connector are disposed so that the conductive elements 2903 on the printed circuit boards 2901, 2902 may be parallel to and opposite each other.

Figure 30:
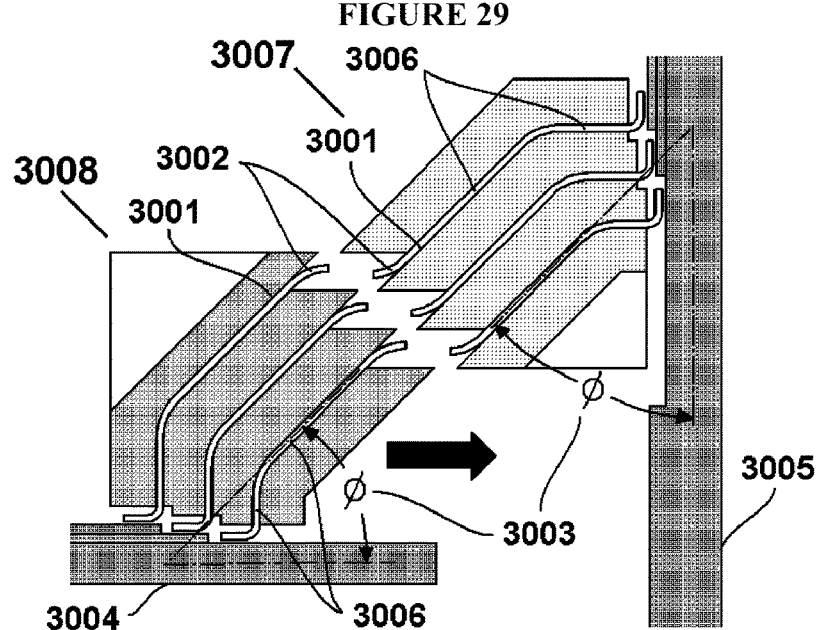
FIG. 30 shows an embodiment wherein the curved conductive elements are at an angle with respect to the surfaces of the electrical components.

FIG. 30 illustrates an embodiment, a two-part electrical connector assembly having electrical connectors 3007, 3008 wherein, in either electrical connector 3007, 3008, the electrical contact areas 3001 of the conductive elements 3002 are at an angle Ø 3003 with respect to the surfaces of the electrical components such as printed circuit boards 3004, 3005 rather than being parallel to them as previously shown. The conductive elements 3002 are conductively attached to conductive entities 3006 or signal traces in either of the electrical connectors 3007 or 3008. As the electrical component, a daughter card 3004, whose mating direction is illustrated by the arrow, moves toward the other electrical component, a backplane 3005, the conductive elements 3002 flatten against each other as they electrically mate. Although the angle Ø 3003 at which the conductive elements 3002 come together is different from the ones shown in FIGS. 5 through 29, the conductive elements 3002 operate in the same manner.

Figure 31:
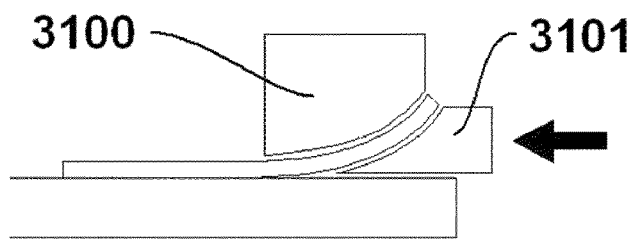
FIGS. 31 and 32 illustrate methods for bending the curved conductive element into a curved shape.
Figure 32:
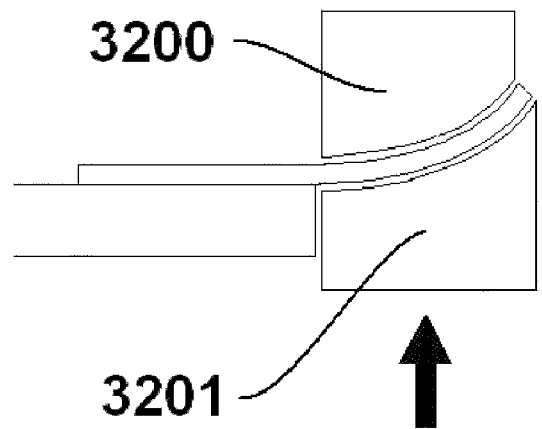

There are numerous methods for manufacturing and bending the ends of the springs into conductive elements. The rows of these conductive elements may be simultaneously etched from metal lead frames, stamped from strips of metal foils or manufactured by many other methods. FIGS. 31 and 32 show various methods whereby tooling is used to place a permanent curve in the conductive elements. The arrows indicate the direction of tool movement. The anvils 3100, 3200 are placed on the pre-bent conductive elements as static parts of the tooling, then the hammers 3101, 3201 move as indicated by the arrows and permanently bend the conductive elements as shown.

In another manufacturing and bending method, when the conductive elements are in the flat, unbent shape, a laser can quickly heat the top surface of the conductive elements creating a compressive stress in the top layers of the conductive element. If an adhesive film or layer adheres the conductive element to the underlying substrate, then an etchant can dissolve the adhesive film and release the conductive element so it will curve upward away from the substrate.

In another manufacturing and bending method, a proprietary method called Laser Peen® can be used to bend the conductive elements. The conductive element is painted with a black paint and the part submerged under a water curtain. A laser pulse passes through the water and strikes the black paint vaporizing it. The vapor absorbs the laser light, which produces a rapidly expanding plasma plume. The expanding plasma is confined between the surface of the conductive element and the water curtain. The plasma creates a rapidly rising high-pressure shock wave that travels into the material. The shock wave creates a peak stress that yields and "cold works" the metal to plastically deform the conductive element at the surface. The compressive residual stresses thus formed in the top layer or surface of the metal curls the conductive element upward when the conductive element is released from the underlying substrate. The compressive residual stresses increase the metal's resistance to fatigue, fretting fatigue, and stress corrosion cracking.

Another manufacturing and bending method for the conductive elements is to use various electroplating or electrocoating methods. For instance, both tensile and compressive stresses can be produced while nickel plating. The stresses are induced by lowering temperature to or below low temperature (50-60 degrees C.), manipulating the PH of the plating baths, using an organic material, or employing higher current density than usual. Nickel sulfamate baths will plate pure low-stressed finishes without using additives. Thus tensile layers can be plated on the metal surface next to the underlying substrate and compressive layers plated on the top metal surface. A finishing gold plate will provide a low electrical contact resistance and corrosion-resistance.

Another manufacturing and bending method is to etch or stamp the shape of the conductive elements out of metal or conductive material layers in printed circuit board stock material or flexible circuit stock material. Although not limited to these manufacturing methods, the dielectric or adhesive material under the conductive element may be removed by various mechanical removal methods such as grinding or machining, by chemical removal methods or by other methods not described here. The released conductive elements can be bent into shape by the various methods described in the previous paragraphs above.

Figure 33:
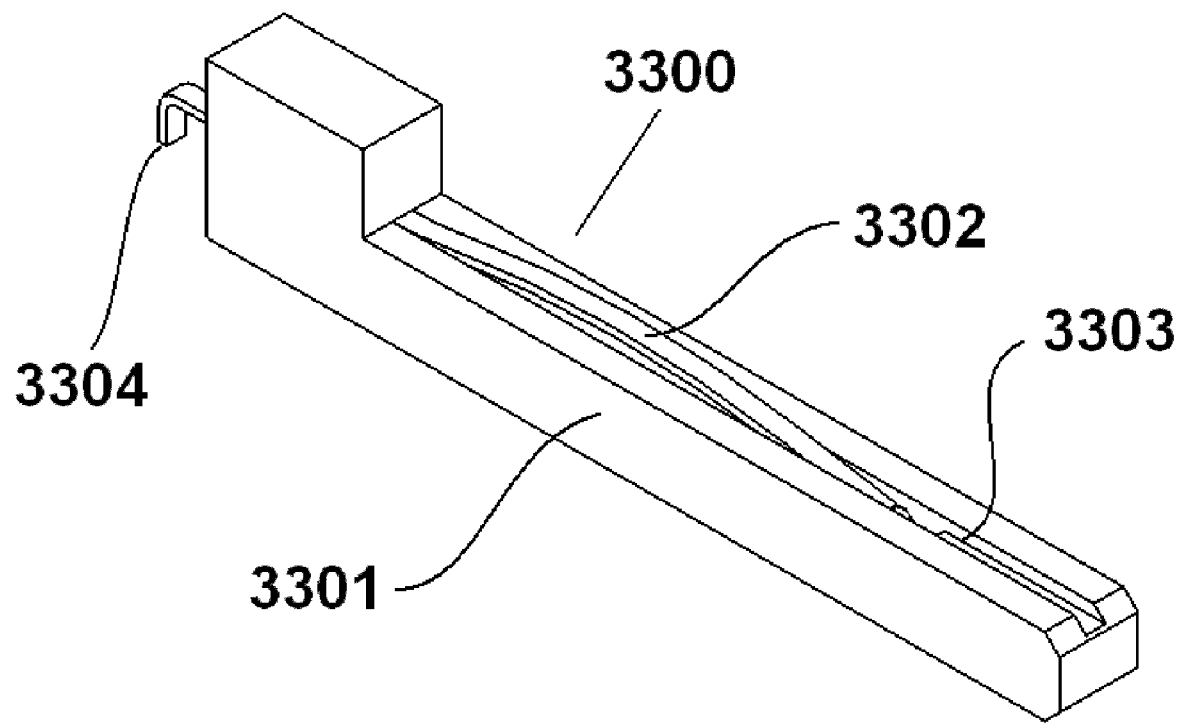
FIG. 33 shows an isometric view of an embodiment wherein a pivoting conductive element is enclosed in an insulative mating post.

FIG. 33 shows an alternate embodiment, an isometric view of an electrical interconnection device, a post assembly 3300 wherein a pivoting conductive element 3302 is encased in a groove 3303 in an insulative mating post 3301. For illustrative purposes, the bent solder tail 3304 of the pivoting conductive element 3302 is shaped to allow surface mount soldering to the solder pad of a printed circuit board.

Figure 34:
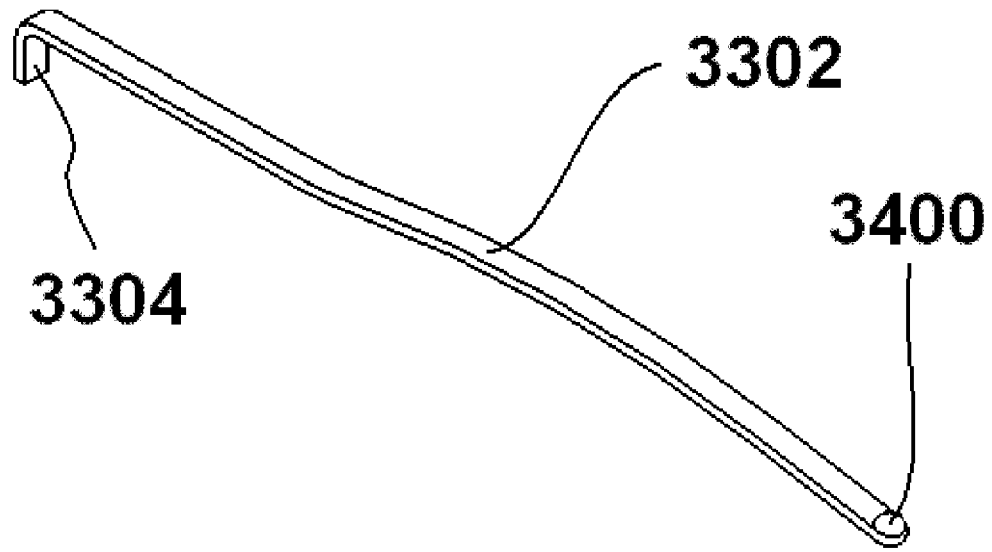
FIG. 34 illustrates the structure of the pivoting conductive element in FIG. 33.

FIG. 34 illustrates an isometric view of the pivoting conductive element 3302 showing its curved nature with an electrical contact 3400 at its right end. In FIG. 34, the electrical contact has a hemispherical shape, but may also be a conical shape, a sharp point or the like. The bent solder tail 3304 can be surface mount soldered to the solder pad of a printed circuit board. Alternatively, the tail can be a press fit type tail that is press fit into the plated through holes of a printed circuit board or the tail may be any of several different types found in the electrical connector industry. Alternatively, the bend solder tail can be replaced by a conductive element 500 as shown in FIG. 5 that can mate with corresponding conductive elements on electrical components.

Figure 35:
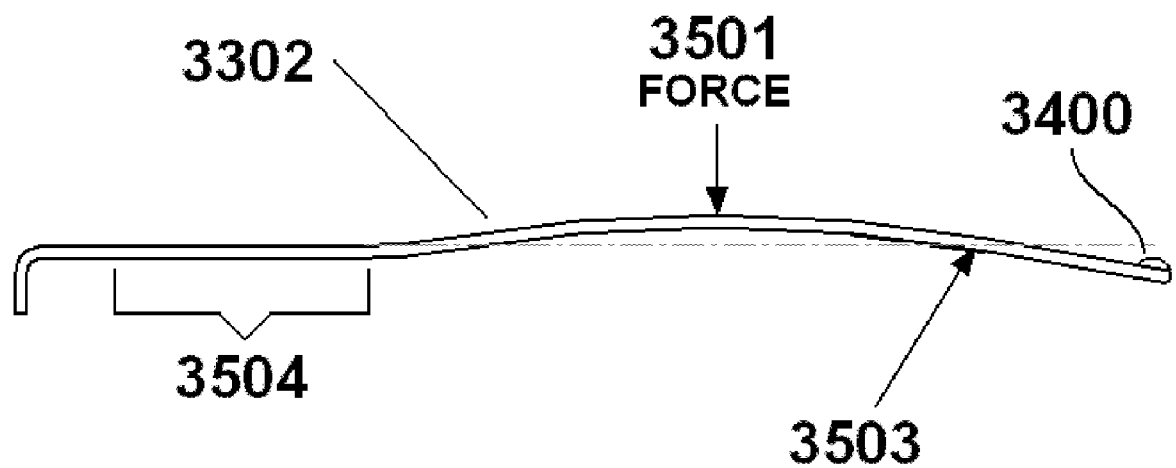
FIG. 35 illustrates the various features of the embodiment and the pivoting conductive element in FIG. 33.

FIG. 35 illustrates the pivoting conductive element 3302, which has a straight region 3504 that is fixed within the material of the mating post 3301 shown in FIG. 33. A pivot point 3503 corresponds to an edge (or corner) 3601 (shown in FIG. 36) on the mating post 3301. When a force 3501 is applied downward on the curved portion of the pivoting conductive element 3302, it begins to flatten out because the fixed region 3504 and the edge 3601 (shown in FIG. 36) act as reactive supports. This causes the electrical contact 3400 to rise upward.

Figure 36:
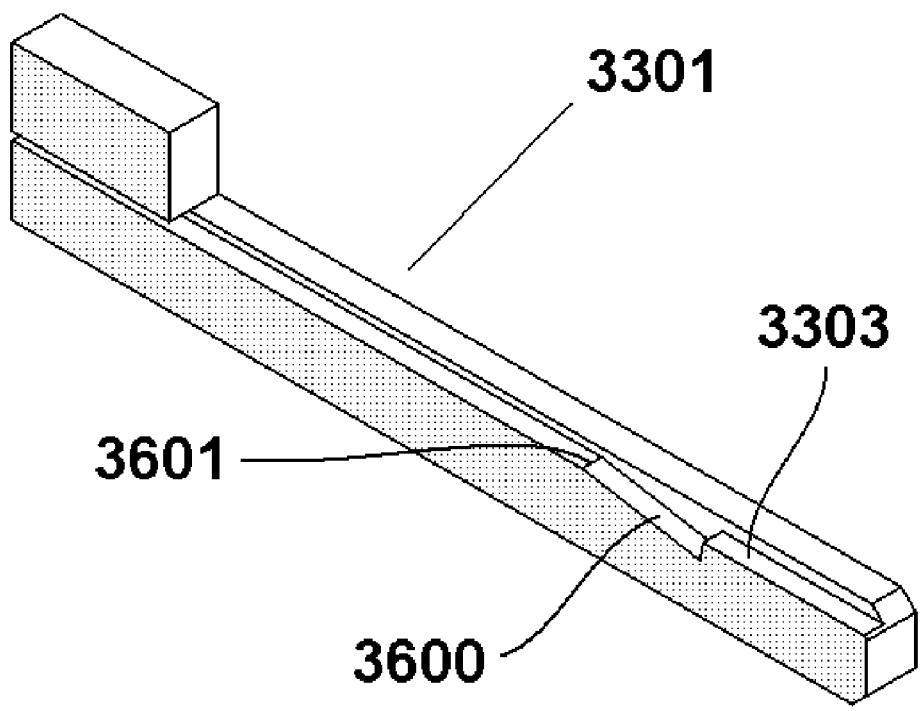
FIG. 36 is a sectioned view of the features in the mating post shown in FIG. 33.

FIG. 36 is a sectioned view of the mating post 3301 showing the details of the groove 3303. The cutout 3600 provides room for the right end of the pivoting conductive element 3302 to move in an unimpeded fashion. The edge (or corner) 3601 is a pivot point 3503 on the pivoting conductive element 3302.

Figure 37:
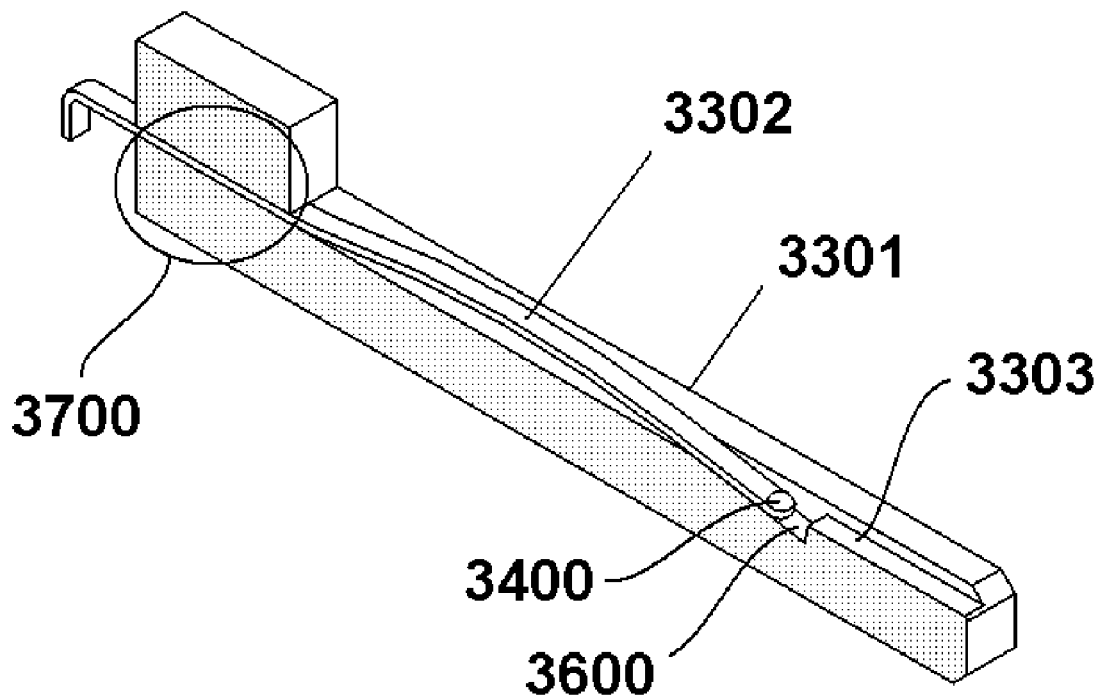
FIG. 37 is sectioned view of FIG. 33 showing the pivoting conductive element assembled into the mating post.

FIG. 37 is a sectioned view of the assembly in FIG. 33. The circled area 3700, which corresponds to the straight region 3504 in FIG. 35, illustrates how the mating post 3301 captures the pivoting conductive element 3302. The cutout 3600 provides room for the right end of the pivoting conductive element 3302 allowing the top surface of the electrical contact 3400 to reside below the bottom surface of groove 3303.

Figure 38A:
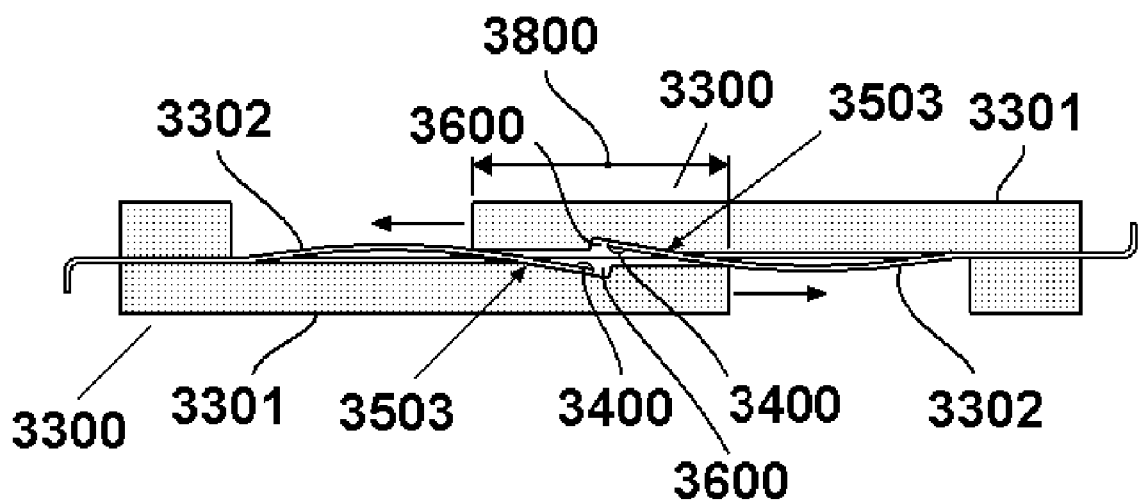
FIGS. 38A, 38B, and 38C illustrate the different positions of the pivoting conductive elements and the post assemblies in FIG. 33 as they mate.
Figure 38B:
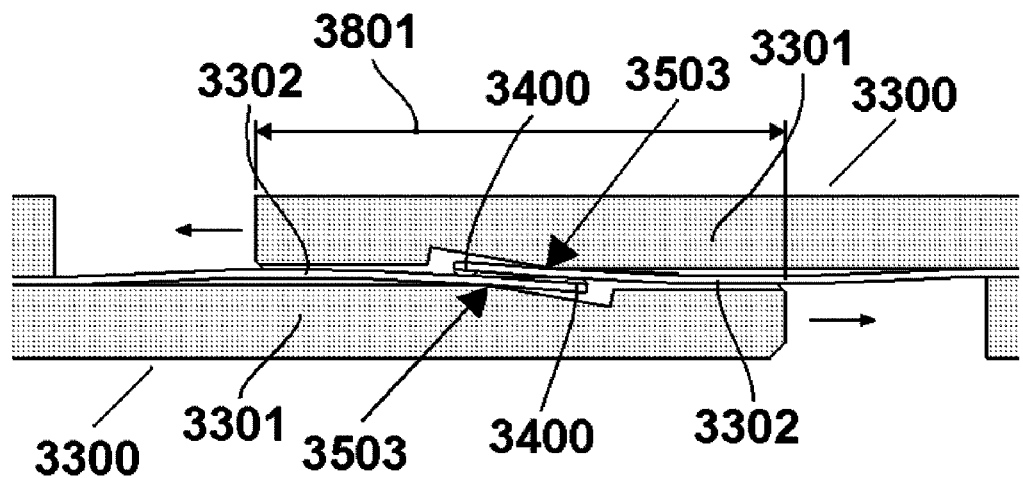
Figure 38C:
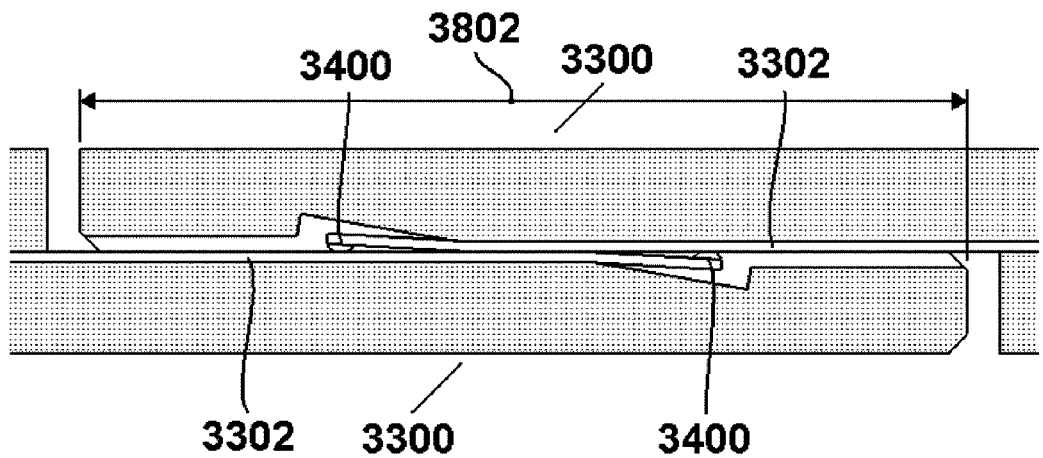

In FIGS. 38A through 38C, the post assemblies 3300 have been sectioned to show how they electrically mate. FIG. 38A is a sectioned view of two post assemblies 3300. A generally tubular housing (not shown here) encloses and guides the post assemblies 3300. The assemblies move together in the direction indicated by the arrows with an initial engagement length 3800. The electrical contacts 3400 are recessed inside the cutouts 3600, which allow the electrical contacts 3400 to slide past each other as the post assemblies 3300 are mated together as shown in FIG. 38B.

In FIG. 38B, the post assemblies 3300 have moved closer together, with intermediate engagement length 3801, so that the electrical contacts 3400 on each pivoting conductive element 3302 have moved past each other and begun to touch the curved portion of the opposing pivoting conductive element 3302. The electrical contacts 3400 have moved beyond the pivot point 3503. As the electrical contacts 3400 continue moving past the pivot points 3503, the electrical contacts place force on the opposing pivoting conductive element 3302. Since the mating posts 3301 constrain the pivoting conductive elements 3302, this action flattens them producing the necessary contact force and low electrical contact resistance.

In FIG. 38C, the post assemblies 3300 are in the fully mated position with final engagement length 3802. The pivoting conductive element 3302 is mated electrically and has been forced into a flat or nearly flat shape. Any portion of a pivoting conductive element 3302 projecting beyond its electrical contact 3400 is negligible and does not act as a capacitive stub.

Figure 39:
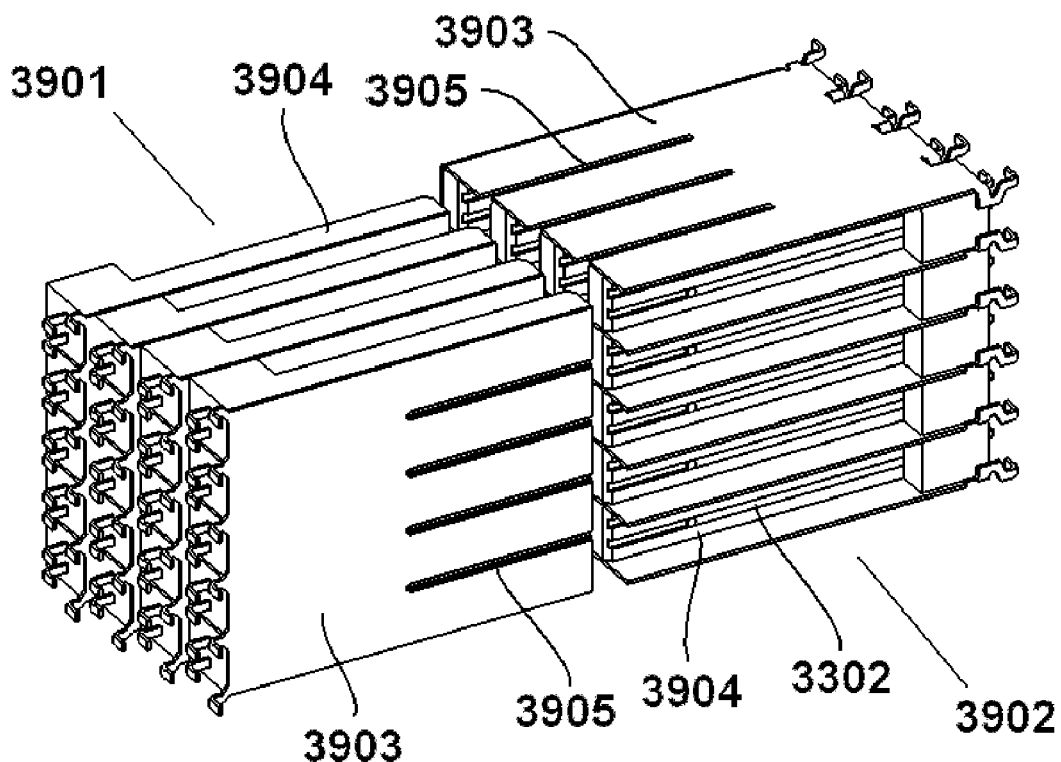
FIG. 39 illustrates an embodiment, an electrical connector composed of arrays of the pivoting conductive elements and post assemblies shown in FIG. 33.

FIG. 39 illustrates electrical connectors 3901, 3902 composed of arrays of post assemblies 3904. The latter are similar to post assemblies 3300 except that two pivoting conductive elements 3302, if desired, may be placed side by side in each mating post to create a differential pair. Groundplanes 3903 separate rows of post assemblies 3904. Slots 3905 in the groundplanes 3903 allow the groundplanes in the mating electrical connectors to interleave with each other when the electrical connector pair is mated. This provides isolation of any post assembly 3904 from any other to reduce crosstalk between differential pairs or single ended conductors. Although FIG. 39 illustrates a mating electrical connector pair that interconnects mezzanine or piggyback printed circuit boards, one of the post assemblies 3904 could be redesigned so that its pivoting conductive elements 3302 and its groundplanes 3903 are bent at 90 degrees or some other angle. This would create an electrical connector that would interconnect printed circuit boards disposed at various angles to each other. As an example, the angled electrical connector on a line card could plug into an electrical connector on a backplane wherein the line card and backplane are at varying angles with respect to each other.

Figure 40:
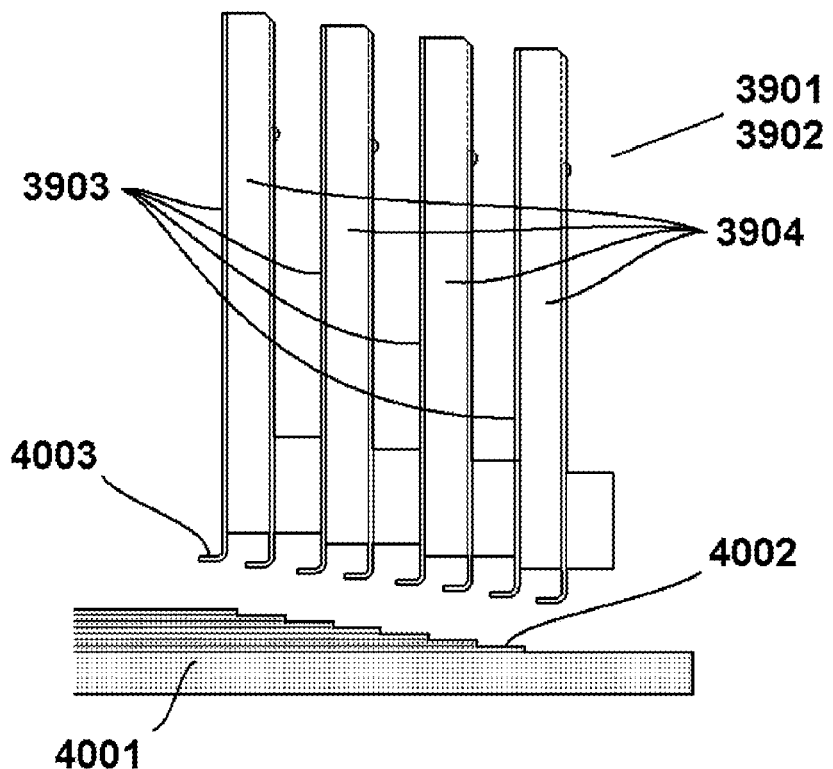
FIG. 40 illustrates an embodiment, the pivoting conductive elements and post assemblies shown in FIG. 33 staggered vertically so that the surface mount solder tails conform to the stair step surfaces on the electrical component to be connected.

FIG. 40 illustrates a side view of electrical connectors 3901 or 3902. Each post assembly 3904 has additional post assemblies behind the ones shown. These comprise a row of post assemblies attached to groundplanes 3903. The rows are vertically staggered so that the surface mount tails 4003 can be attached to solder pads on the stair step surfaces 4002 of a printed circuit board 4001. Electrical connectors 3901 or 3902 could be designed so that end users or manufacturers of the rows of post assemblies 3904, or any type of post assembly mentioned herein, could adjust the amount of their vertical staggering to match the vertical distances of adjacent electrical contact rows on mating stair step printed circuit boards, stair step electrical components or the like.

Figure 41:
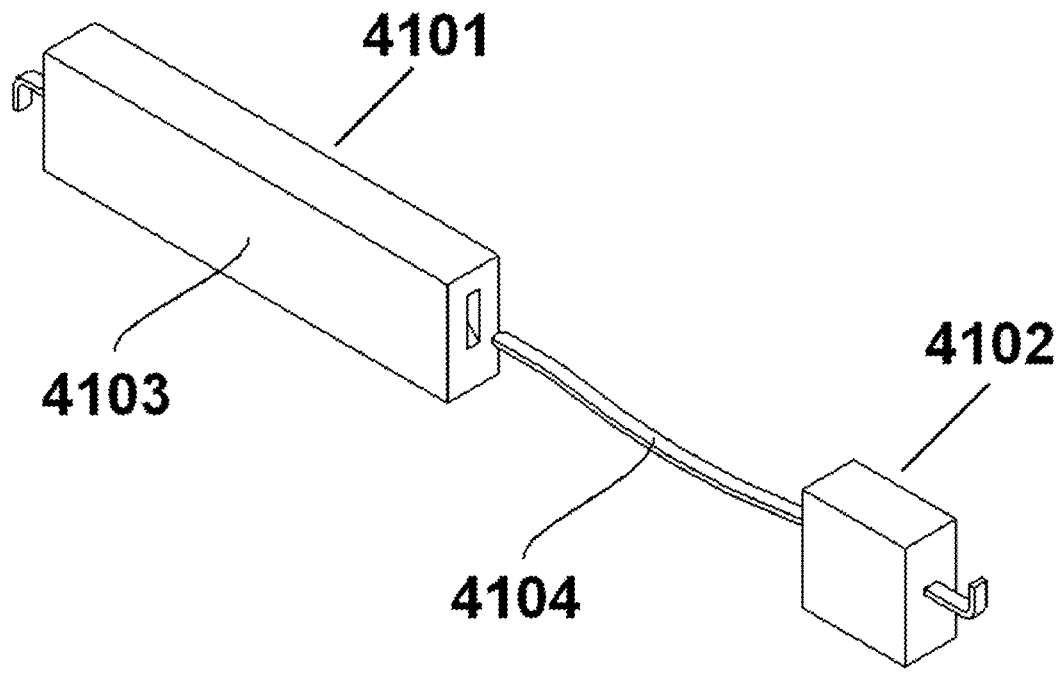
FIG. 41 illustrates an embodiment, a post assembly enclosing a straight conductive element (not shown) and a post assembly having an inline conductive element.

FIG. 41 illustrates an embodiment of the electrical interconnection device, a post assembly 4101 enclosing a conductive element (not shown), fully enclosed inside the insulative mating post 4103, and a post assembly 4102 having an inline conductive element 4104. A generally tubular housing (not shown here) encloses and guides the post assemblies 4101, 4102.

Figure 42:
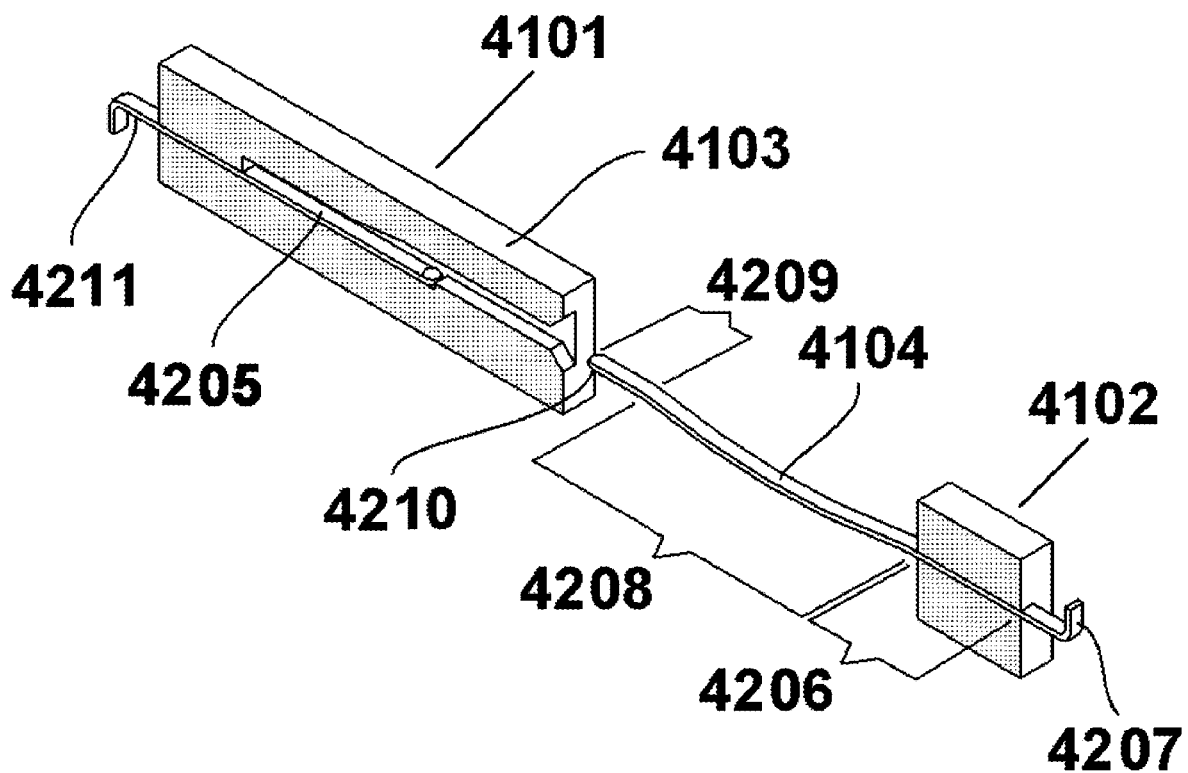
FIG. 42 illustrates a sectioned view of the assemblies shown in FIG. 41.

FIG. 42 illustrates a sectioned view of the post assemblies 4101, 4102 shown in FIG. 41. The conductive element 4205 is fixed with respect to the mating post 4103 and straight or generally straight in the region between its surface mount solder tail 4211 and the electrical contact at its other end. The post assembly 4102 has an inline conductive element 4104 that is unsupported except in the fixed region 4206 as shown in FIG. 41. The inline conductive element 4104 is comprised of an attachment lead 4207, a curved leaf spring portion 4208, a straight portion 4209 bent downward at an angle to the leaf spring, and an electrical contact 4210 at the end of the straight portion. The attachment leads 4207, 4211 may be replaced by surface mount solder leads, straight solder leads, press-fit leads or the like. Alternatively, the attachment leads 4207, 4211 can be replaced by conductive elements 500 as shown in FIG. 5 that mate with corresponding conductive elements on electrical components.

Figure 43A:
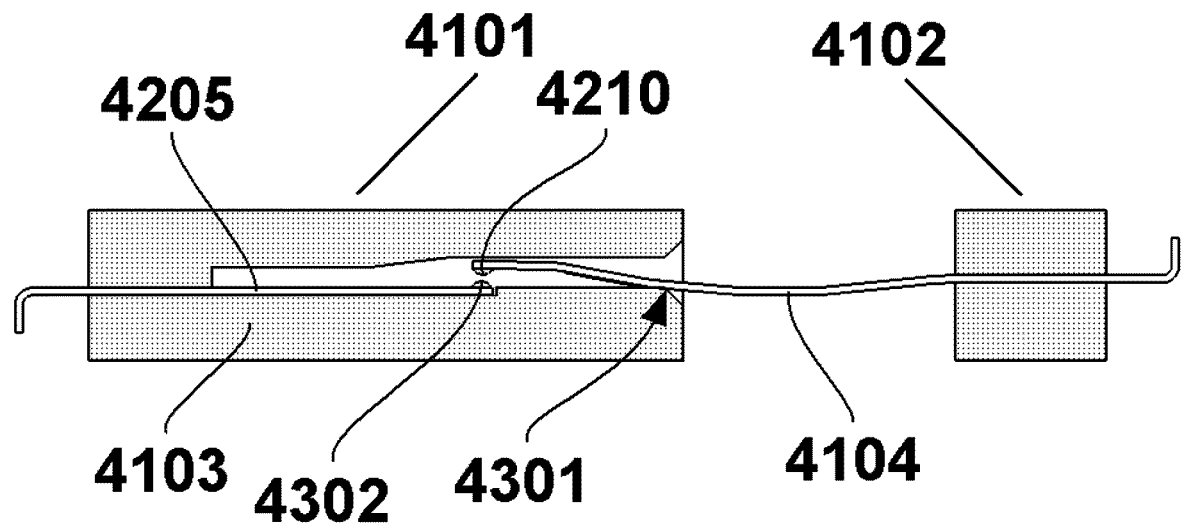
FIGS. 43A, 43B illustrates the mating action of the post assemblies in FIG. 42.
Figure 43B:
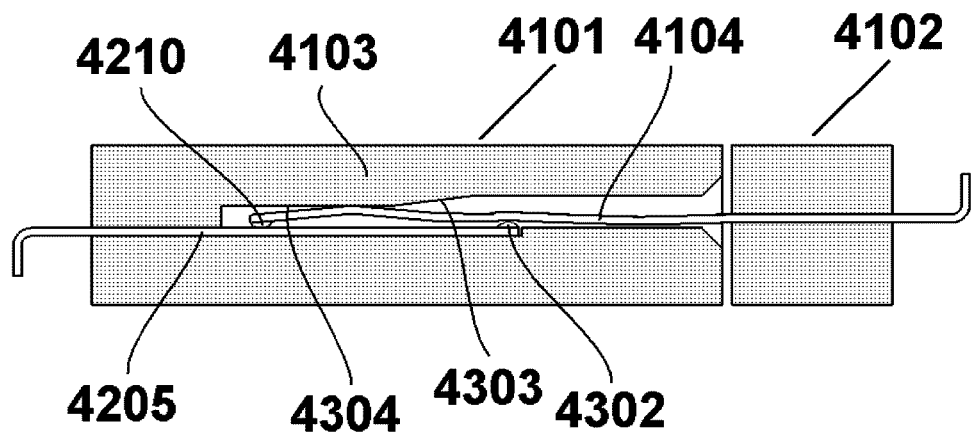

FIGS. 43A, 43B illustrate the how the post assemblies 4101, 4102 mate and electrically interconnect. FIG. 43A illustrates an inline conductive element 4104 inserted partially into post assembly 4101. The bottom surface of the inline conductive element 4104 slides over corner 4301 and inside mating post 4103, which lifts electrical contact 4210 over and past electrical contact 4302. FIG. 43B illustrates the fully mated post assemblies 4101, 4102. As post assembly 4102 is partially inserted into post assembly 4101, inline conductive element 4104 will slide under the ramp surface 4303 inside mating post 4103. This action forces electrical contact 4210 downward towards conductive element 4205. As post assembly 4102 is inserted farther into post assembly 4101, inline conductive element 4104 slides along surface 4304 which fully forces electrical contact 4210 onto the top surface of conductive element 4205. The foregoing action also causes the bottom surface of inline conductive element 4104 to be forced downward upon electrical contact 4302. Two redundant electrical interconnections are generated and unwanted capacitor stubs are eliminated.

An electrical connector containing an assembly of post assemblies 4101 may electrically interconnect with an electrical connector containing a correspondingly arranged assembly of post assemblies 4102 thereby electrically interconnecting a plurality of electrical components. Post assemblies 4101, 4102 can replace post assemblies 3904 to create the same electrical isolation as in electrical connectors 3901, 3902, which are surrounded by groundplanes 3904 as shown in FIG. 39.

Figure 44:
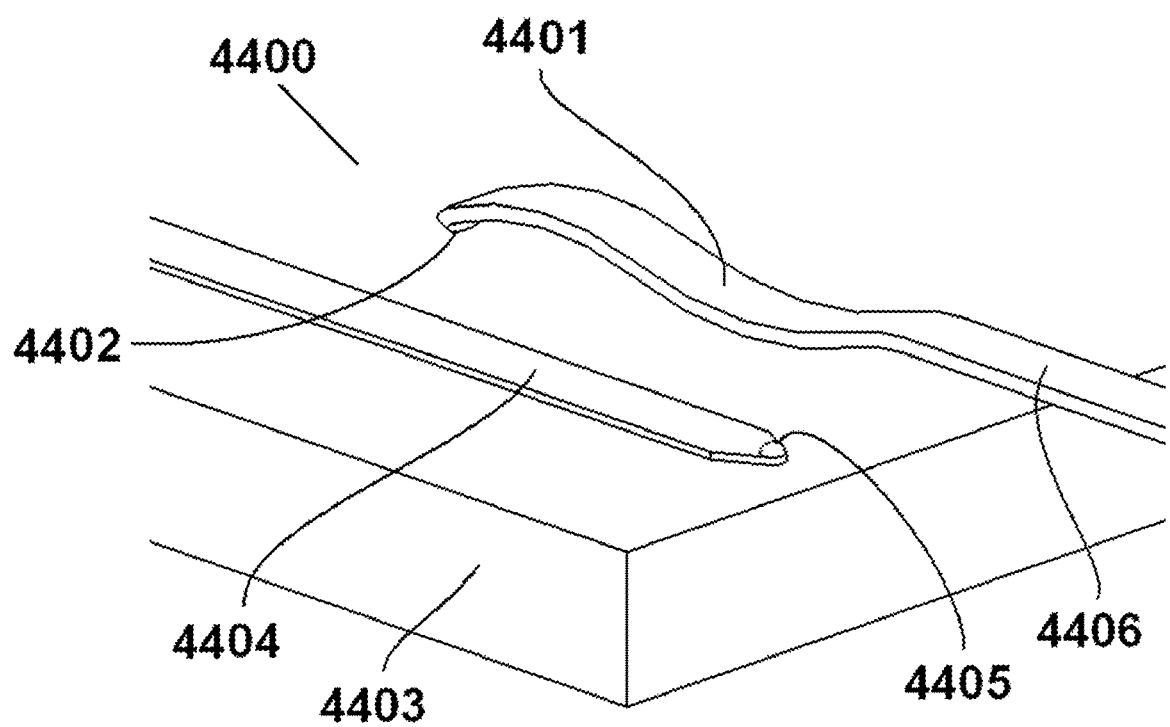
FIG. 44 illustrates an embodiment of an electrical assembly comprised of a paralleled conductive element and a signal trace.

FIG. 44 illustrates an embodiment of an electrical interconnection device 4400 comprised of a paralleled conductive element 4401, a signal trace 4404 with electrical contact 4405 and a first dielectric layer 4403 in an electrical component such as a printed circuit board. Signal trace 4404 is fixed to the electrical component and is typically etched from copper foil. The paralleled conductive element 4401 has an electrical contact 4402 at its extreme end, a central portion with a generally s-shaped or z-shaped curve and a straight portion 4406 at the other end fixed to a second dielectric layer (not shown to give a clear view of the paralleled conductive element 4401 that is part of an electrical component such as an electrical connector.

Figure 45A:
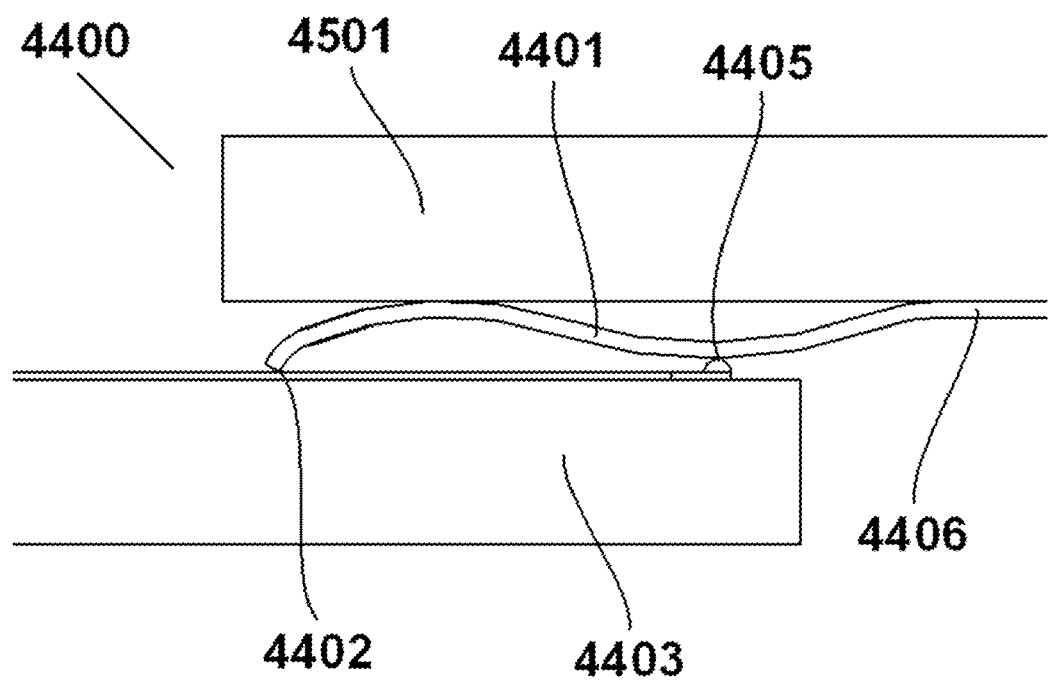
FIG. 45A illustrates the electrical assembly in FIG. 44 just as its electrical contacts touch.

FIG. 45A illustrates the electrical interconnection device 4400 in a side view as the electrical contacts 4402, 4405 begin to electrically mate. The paralleled conductive element 4401 has a straight portion 4406 fixed to a second dielectric layer 4501, which was not shown in the previous figure.

Figure 45B:
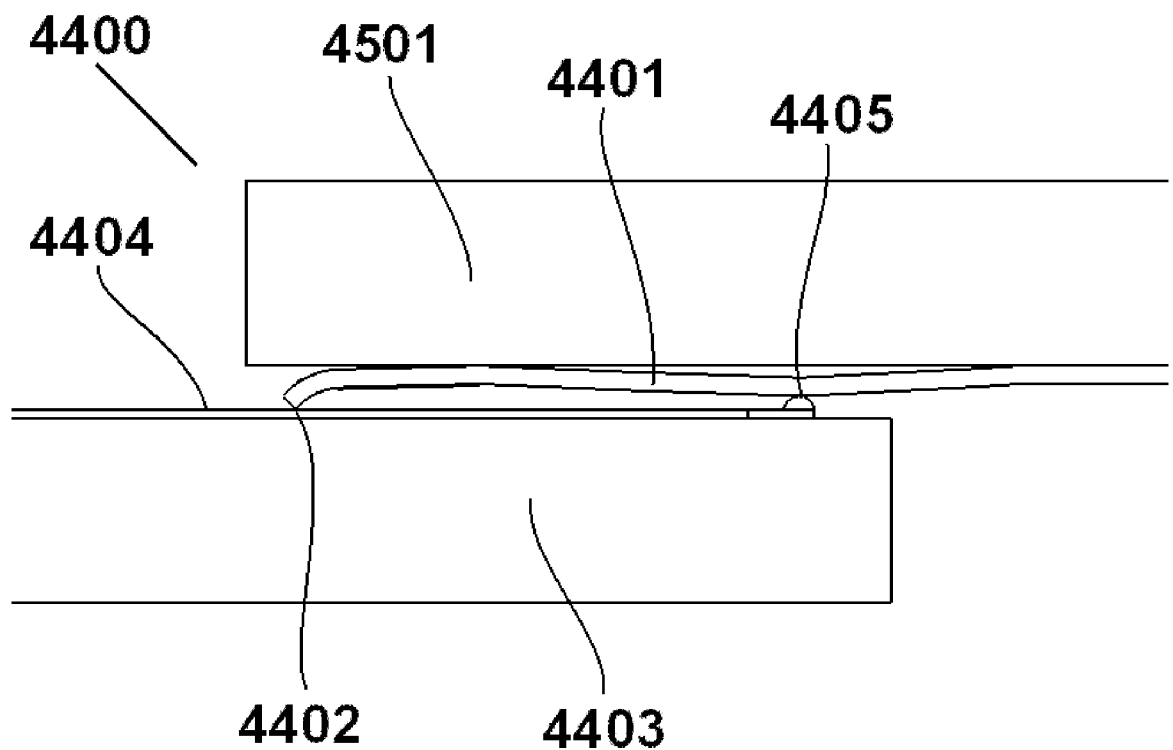
FIG. 45B illustrates the electrical assembly in FIG. 44 after the signal trace has mated with the paralleled conductive element.

FIG. 45B illustrates the electrical interconnection device 4400 in a side view in the fully electrically mated condition. The second dielectric layer 4501 has moved vertically toward the first dielectric layer 4403. This movement creates contact forces at electrical contacts 4402, 4405 that substantially flattens the paralleled conductive element 4401 against signal trace 4404. The signal trace 4404 can be fabricated using conventional printed circuit board manufacturing methods. The end of the signal trace need not be curved upward away from the underlying substrate nor does it require the attachment of a resilient, curved, conductive element.

Figure 46:
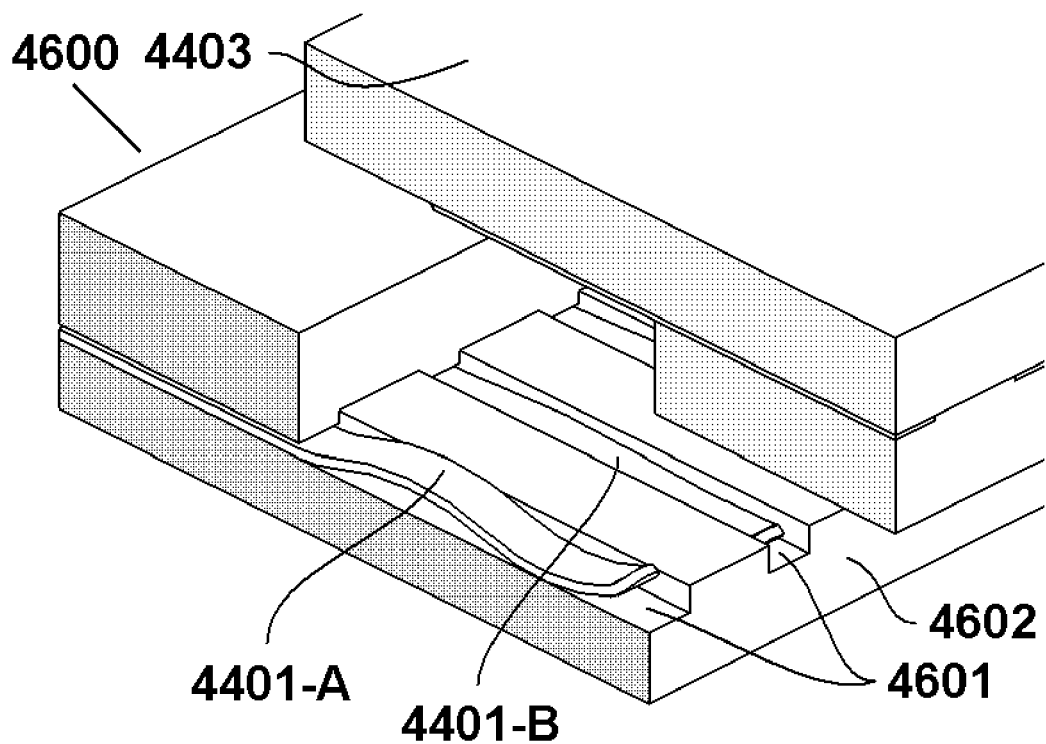
FIG. 46 illustrates the electrical assembly in FIG. 44 with multiple pairs of signal traces and paralleled conductive elements embedded in channels in the underlying substrate.

FIG. 46 illustrates a sectioned view of an electrical interconnection device 4600 wherein the paralleled conductive elements 4401 and/or the signal traces 4404 are placed respectively into channels 4601 in the dielectric layer 4602 or into channels (not shown) in the dielectric layer 4403. The paralleled conductive elements 4401 and the signal traces 4404 are grouped together under the term "paralleled conductive element" or "paralleled conductive elements." In FIG. 46, paralleled conductive element 4401-A is shown in the unmated condition. Paralleled conductive element 4401-B is shown as it would appear in the mated condition. When the dielectric layers 4602, 4403 are brought together, the depth of the channels defines the amount of deflection of any mated paralleled conductive entities to within a desired range, which insures the correct range of electrical contact forces.

Figure 47:
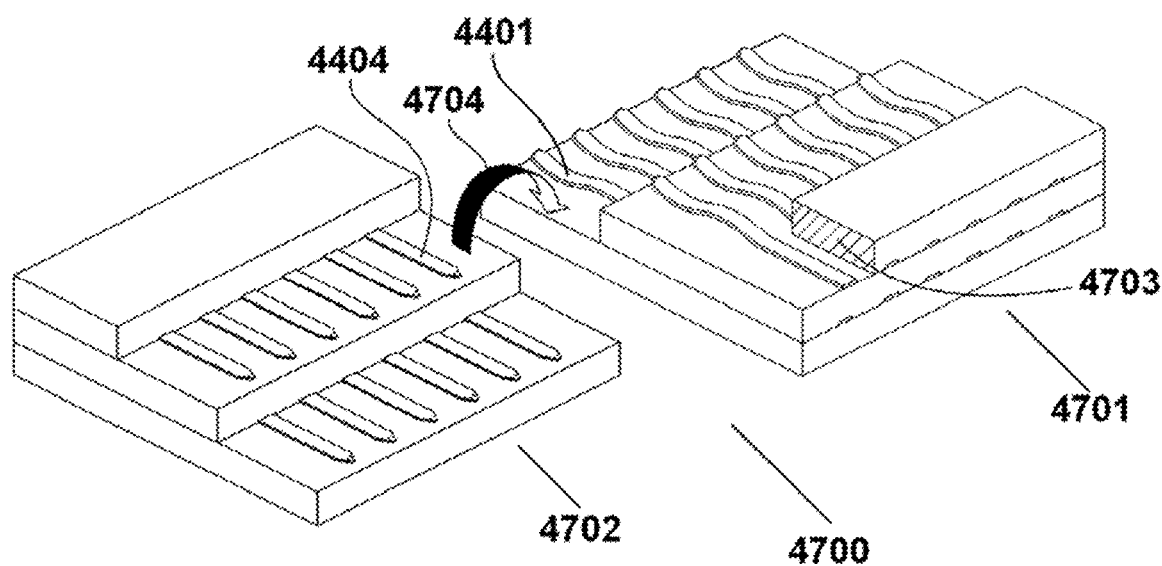
FIG. 47 illustrates a stair step version of the electrical assembly in FIG. 44.

FIG. 47 illustrates an electrical interconnection device 4700 having a stair step configuration. Paralleled conductive elements 4401 can be arrayed in rows on the stair step surfaces of the assembly 4701 that electrically mate with signal traces 4404 arrayed on corresponding rows on the stair step surfaces of the assembly 4702. The top dielectric layer of assembly 4701 is cut away at section 4703 to show the full curvature of paralleled conductive element 4401. For clarity, assembly 4701 has been flipped over 180 degrees as indicated by arrow 4704. The advantages of the embodiment are the elimination of unwanted parasitic capacitances due to capacitive stubs and plated through holes, the creation of two redundant electrical contact points per electrical signal and less costly printed circuit board assemblies.

Figure 48:
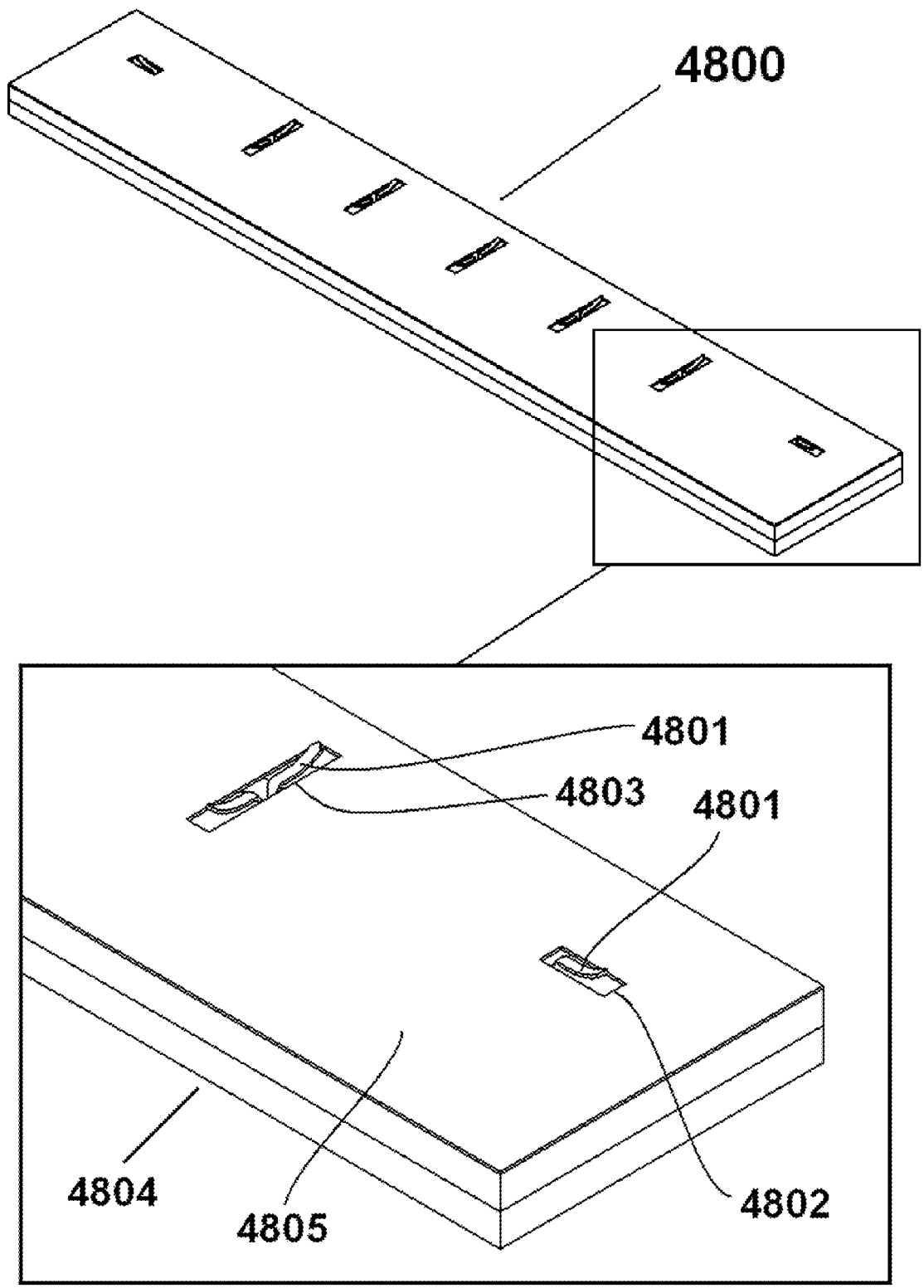
FIG. 48 illustrates another embodiment, a signal or power bus with multiple curved conductive elements on the bus.

FIG. 48 illustrates another embodiment, an electrical bus connector 4800 with multiple conductive elements 4801, periodically attached to a conductive beam, which is embedded inside the layers of a printed circuit board 4804 and have the same properties as conductive elements 500. The multiple electrical contact points at the ends of the conductive elements 4801 allow the same signal to be accessible at several places on the printed circuit board. The conductive elements 4801 protrude through openings 4802, 4803 in the top layer 4805 of the printed circuit board. Conductive elements 4801 can mate with corresponding conductive elements on other electrical components or printed circuit boards (not shown here).

Figure 49:
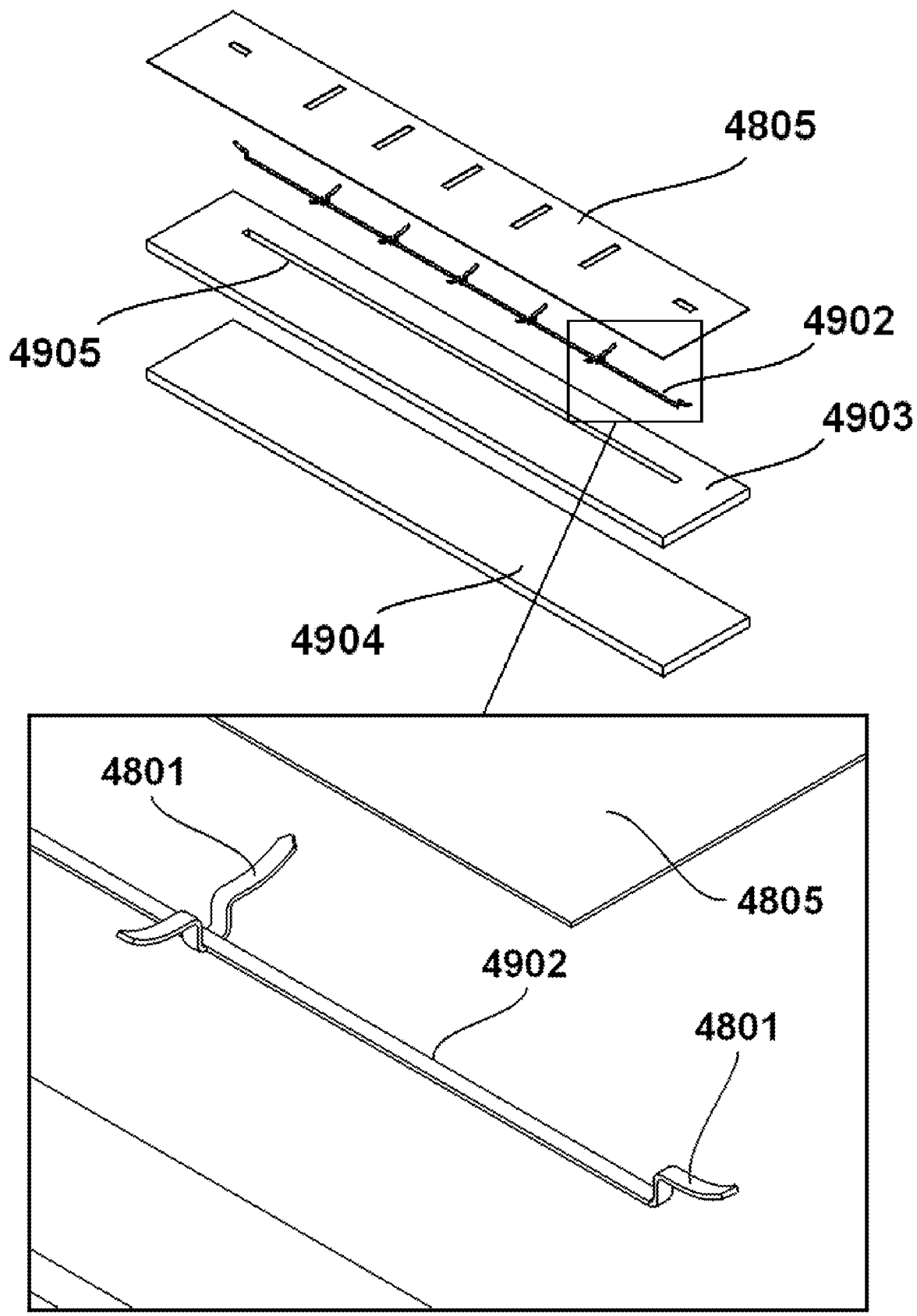
FIG. 49 illustrates the signal or power bus in FIG. 48 with the bus' layers exploded apart.

FIG. 49 illustrates the electrical bus connector 4800 with the printed circuit board layers exploded apart. The top conductive layer 4805 could be the top groundplane of a stripline transmission line structure. The stripline's dielectric is air in this example. The conductive beam 4902, a straight length of conductive material with attached conductive elements 4801 is the signal trace of the stripline, which resides in the slot 4905 in the PCB's middle layer 4903. The top conductive surface of PCB layer 4904 is the lower groundplane for the stripline. The advantage of the embodiment is that the conductive beam 4902 is easily fabricated and low cost. The electrical bus connector 4800 has multiple electrical contacts at the ends of the conductive elements 4801 and each conductive element's geometry creates contact force. Each conductive element 4801 has a corresponding conductive element on a mating part (not shown) such as an electrical connector, printed circuit board, flexible circuit or electrical component. The latter combination reduces the parasitic capacitances in existing electrical connector buses.

The electrical bus connector's conductive beam 4902 with attached conductive elements 4801 may alternatively be fabricated to turn at other angles, may drop down or may go up to other surfaces in a multi-layer electrical connector bus assembly. This property, which is the capability for the electrical connector bus to move upward, downward or sideways to other surfaces, facilitates the mating of conductive elements 4801, which can reside on different stair step surfaces of the electrical connector bus assembly. Conductive elements situated on other printed circuit boards, electronic components or other electrical connectors with a stair step configuration can mate with the electrical connector bus assembly having a corresponding stair step configuration.

Figure 50:
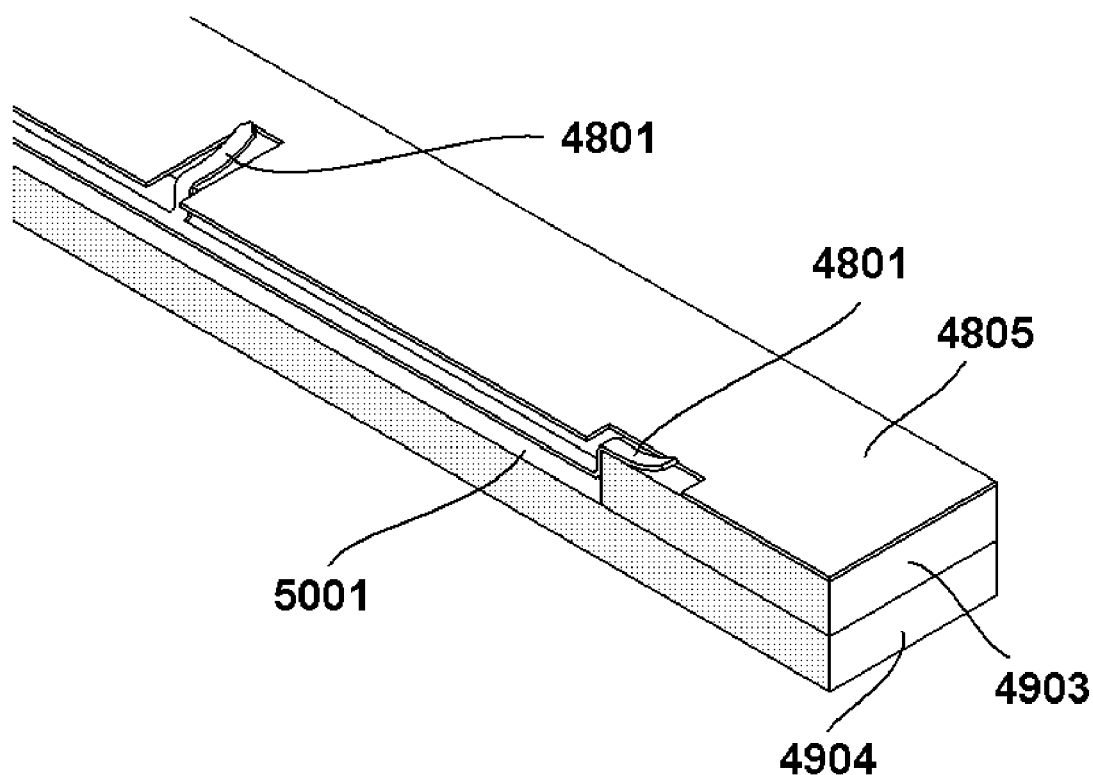
FIG. 50 illustrates a section view of FIG. 49 showing the left side of the signal or power bus' conductor residing inside the cavity formed inside the PCB layers.

FIG. 50 illustrates a section view of the electrical connector bus 4800 in FIG. 48 showing the left side of the electrical bus connector' signal trace residing inside the cavity formed by the printed circuit board layers. The top surface 5001 of printed circuit board layer 4904 is conductive. If the vertical walls of the cavity above surface 4501 are conductively coated, then the electrical connector bus becomes a waveguide or coaxial-like transmission line.

Figure 51:
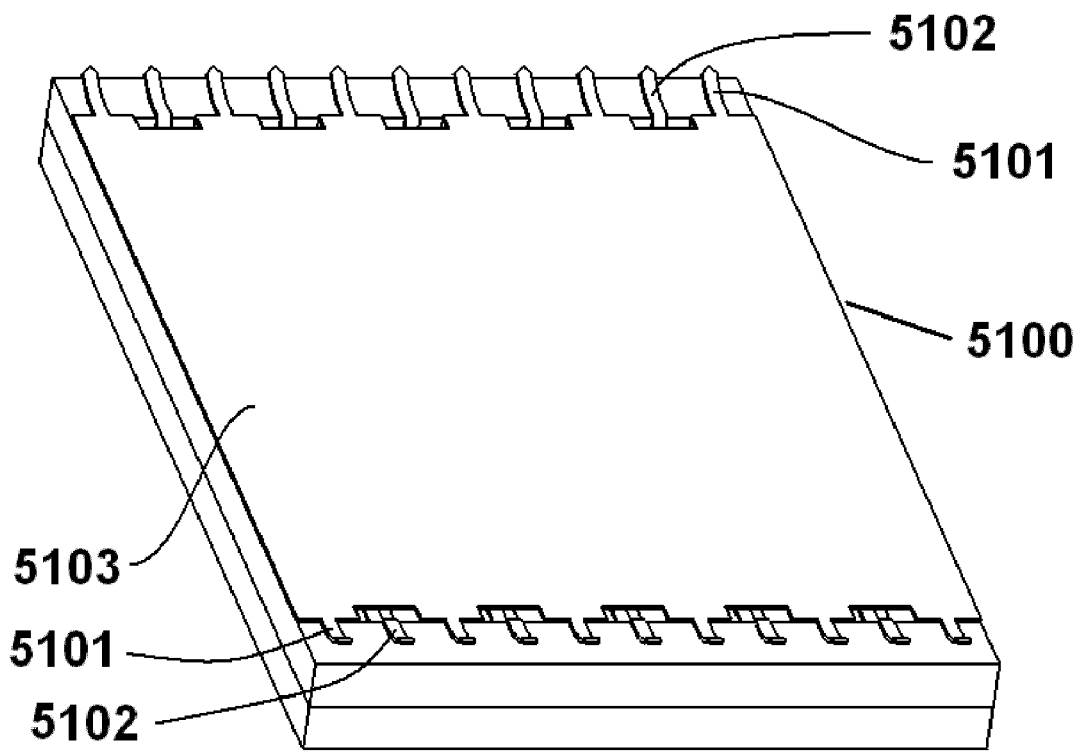
FIG. 51 illustrates an embodiment, curved conductive elements used at the ends of center conductors in coaxial transmission line structures.
Figure 52:
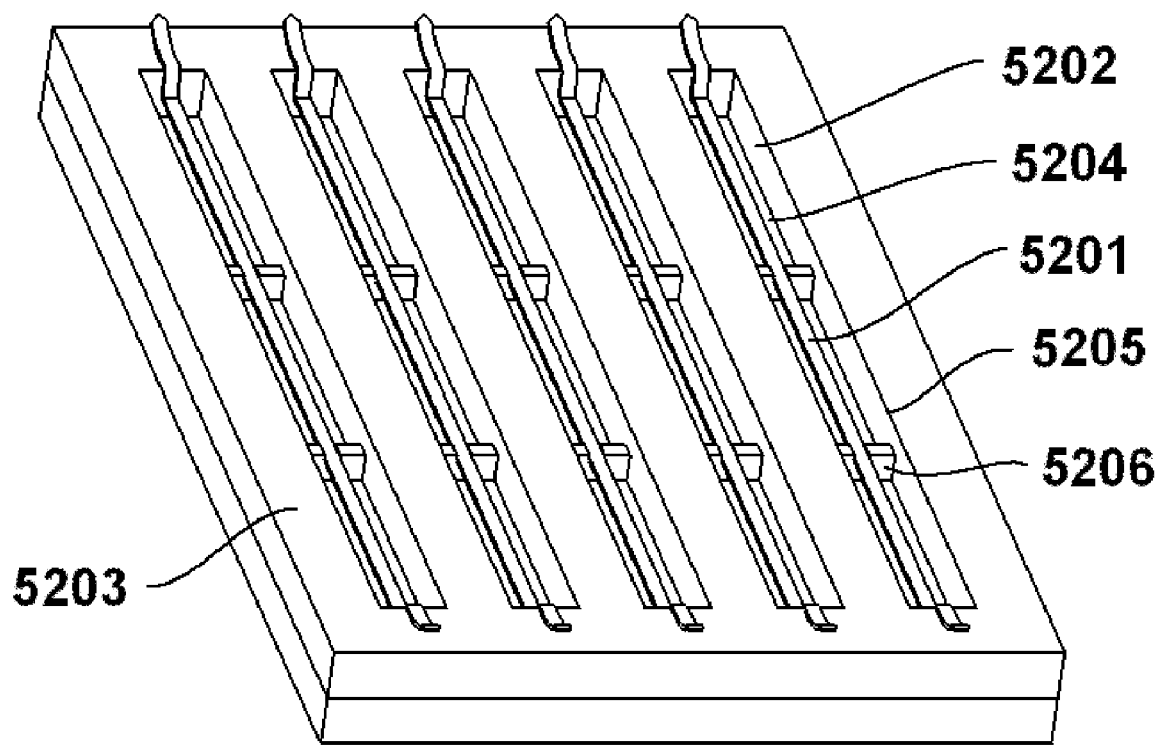
FIG. 52 illustrates the assembly in FIG. 51 without the top ground plane.

FIG. 51 illustrates an electrical bus connector 5100 with ground and signal transmission line structures embedded inside a multi-layer electrical component. Conductive elements 5101, having the same properties as conductive elements 500, are integral with the top conductive layer 5103 that forms the top wall of the outer conductor of the coaxial transmission lines. The conductive elements 5102, having the same properties as conductive elements 500, are at both ends of the center conductors. FIG. 52 illustrates the electrical bus connector 5100 with top conductive layer 5103 removed. A coaxial transmission line is comprised of the top conductive layer 5103, the conductively coated vertical walls 5202 to the left and right of center conductor 5201 in the cavity 5205 in the middle layer 5203, the bottom conductive layer 5204 and the center conductor 5201. The center conductors 5201 are supported by periodic, dielectric supports 5206 preferably having a low dielectric constant, and low loss tangent such as but not limited to foam blocks. The dielectric supports 5206 provide dimensional stability to the center conductors 5201 with respect to the outer conductors described above. The center and outer conductors of the coaxial transmission lines may be straight, may be fabricated to turn at other angles, and may drop down or go up to other coaxial transmission line structures lying above, below or outside the coaxial structure shown in FIG. 51. This property facilitates the mating of conductive elements, which can reside on an electrical component's different stair step surfaces. Conductive elements (not shown here), situated on other electronic components with a stair step configuration can mate with the conductive elements 5101, 5102.

Figure 53:
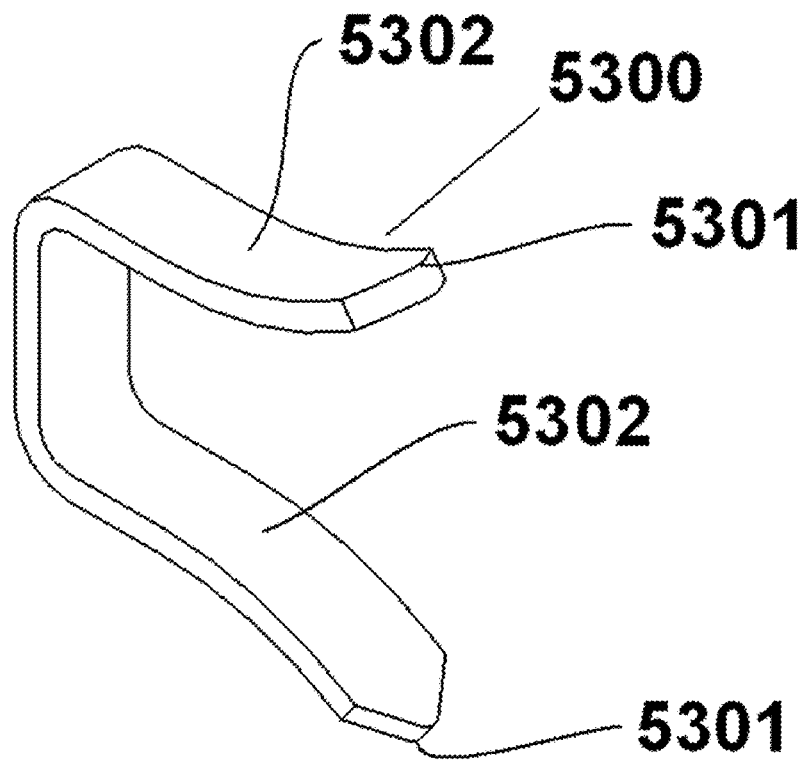
FIG. 53 illustrates an embodiment, a u-shaped interposer conductor using two curved conductive elements for use in an interposer connector.

FIG. 53 illustrates an interposer conductor 5300 with two conductive elements 5302, separated by a U-shaped portion causing the two electrical contacts 5301 to be aligned vertically above each other, for use in an interposer connector. The spring would be captured in the interposer connector by capturing the U-shaped portion of the spring.

Figure 54:
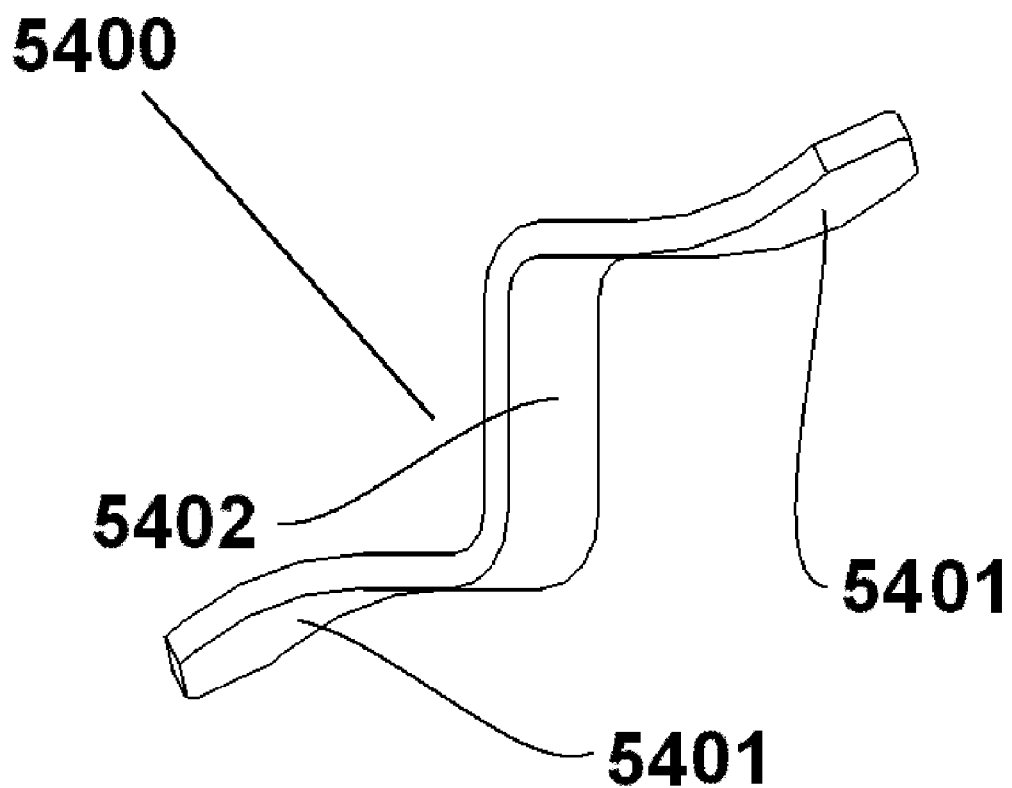
FIG. 54 shows another embodiment of the u-shaped interposer conductor shown in FIG. 53, a z-shaped interposer conductor that could also be used in an interposer connector.

FIG. 54 shows an embodiment of the interposer conductor in FIG. 53, the interposer conductor 5400 wherein the two conductive elements 5401 are disposed 180 degrees from each other about the joining bar 5402, for use in an interposer connector.

Figure 55:
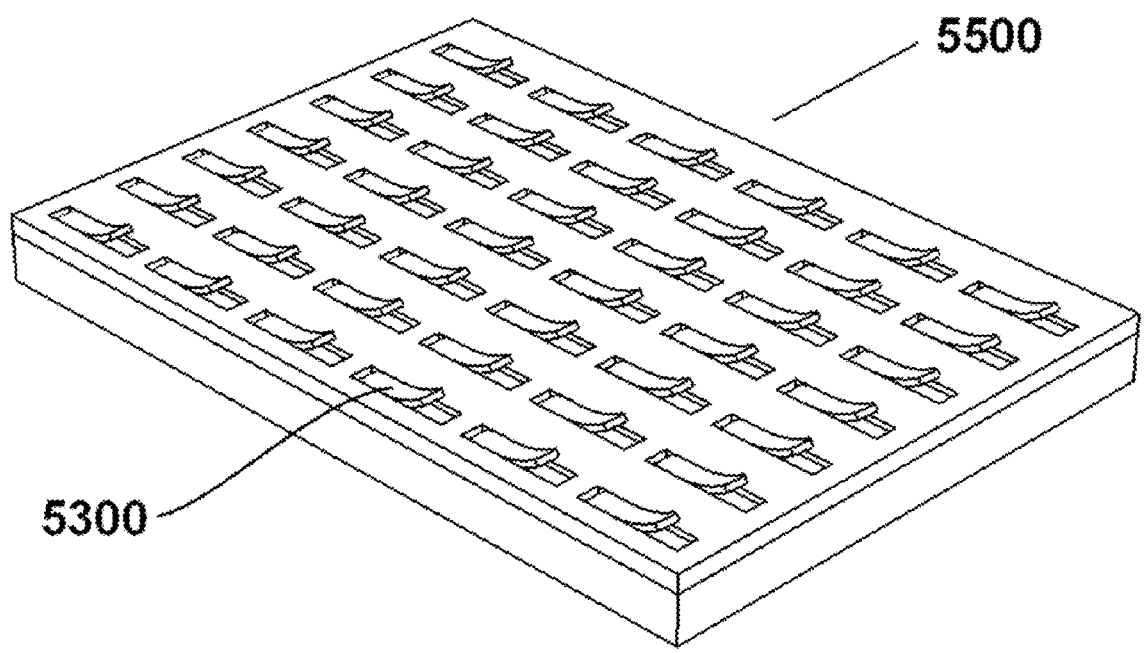
FIG. 55 illustrates an embodiment showing an interposer connector having an array of interposer conductors captured by a capture plate and an array plate.
Figure 56:
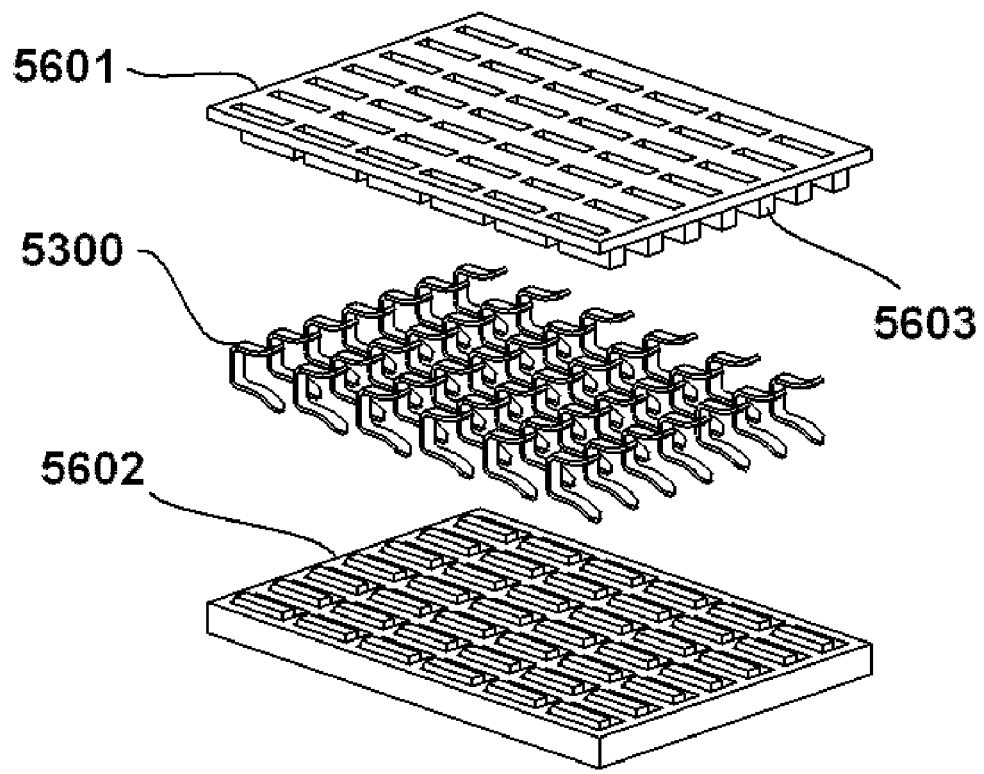
FIG. 56 illustrates an exploded view of FIG. 55.

FIG. 55 illustrates an embodiment, an electrical interposer connector 5500 using an array of interposer conductors 5300. FIG. 56 illustrates an exploded view of the electrical interposer connector 5500. The interposer conductors 5300 are captured by a capture plate 5601 and an array plate 5602. An array of conductive elements 500 shown in FIG. 5, placed on electronic components such as printed circuit boards or the like (not shown in the FIG. 55, 56) can mate with the electrical interposer connector 5500.

Figure 57:
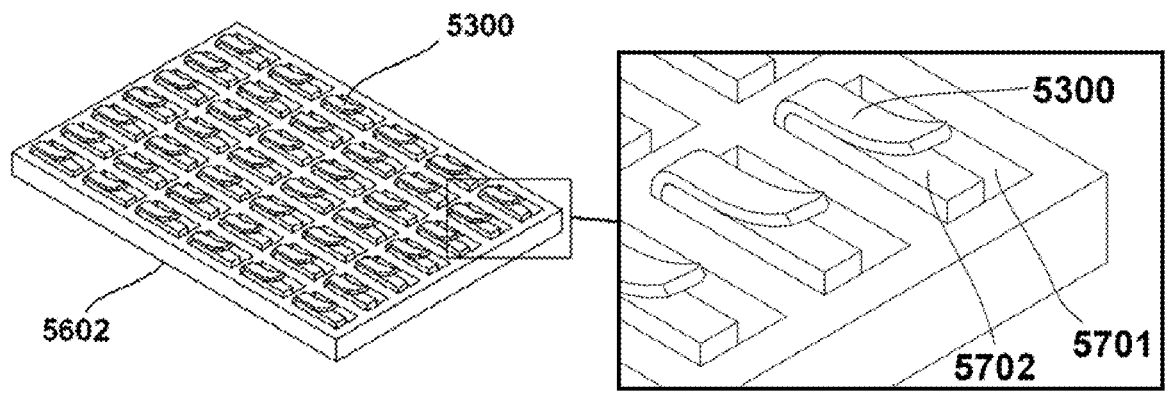
FIG. 57 illustrates the interposer connector in FIG. 55 without the capture plate.

FIG. 57 illustrates the electrical interposer connector 5500 without the capture plate 5601. The interposer conductors 5300 are shown in their assembled positions. During assembly, each interposer conductor 5300 is inserted vertically into the opening 5701 and then moved to the left over the clip flange 5702. The protrusions 5603 (shown in FIG. 56) on the capture plate 5601 fit into all the openings 5701 in the array plate 5602 thus fixing the interposer conductors 5300 with respect to the array plate 5602. The parts of the electrical interposer connector 5500 may be configured so that the interposer conductors are arrayed on stair step surfaces of the electrical interposer connector 5500 to electrically mate with corresponding conductive elements on stair step surfaces of electrical components.

Figure 58:
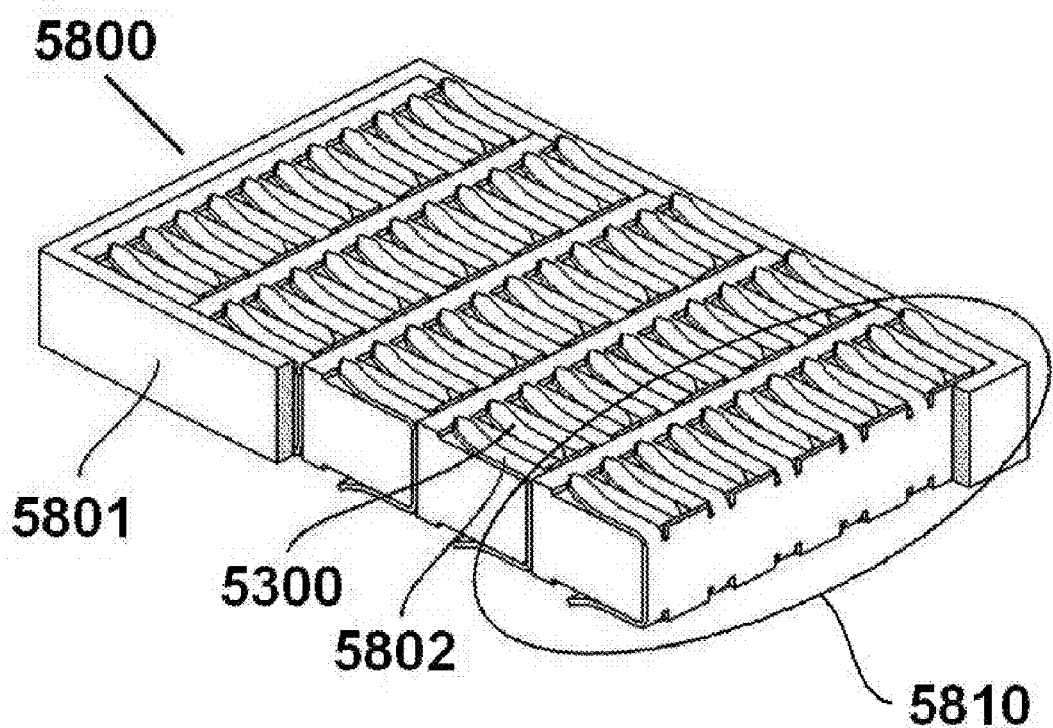
FIG. 58 illustrates an embodiment, an interposer connector with rows of alternating ground springs and signal springs in signal ground bar assemblies.

FIG. 58 illustrates an embodiment, an electrical interposer connector 5800 having interposer conductors 5300 used for signal transmission and conductive elements 5802 used for ground signals. The frame 5801 has been sectioned to show the sides of three of the five signal ground bar assemblies. One signal ground bar assembly 5810 is within the circled area.

Figure 59:
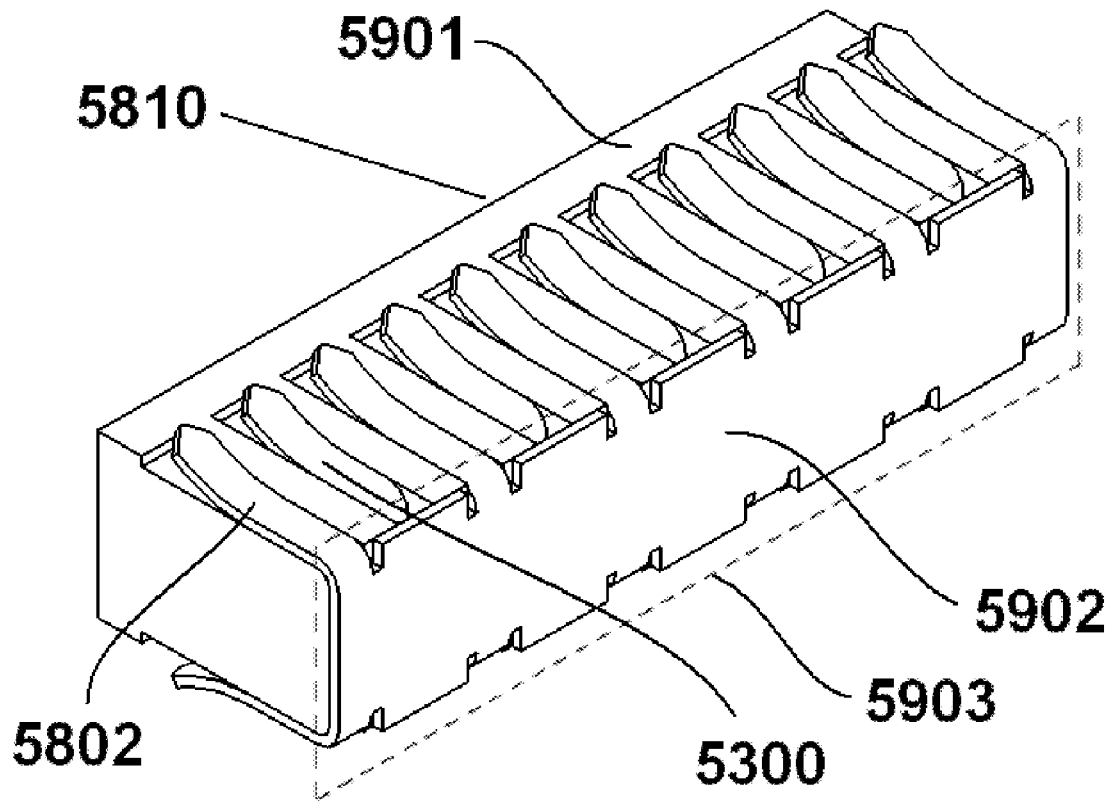
FIG. 59 illustrates a signal ground bar assembly composed of signal and ground springs using the curved conductive element concept.

FIG. 59 illustrates the signal ground bar assembly 5810 composed of an insulator 5901, interposer conductors 5300 and ground shield 5902 having conductive elements 5802 that are attached to the top and bottom of the shielding groundplate 5903. The ground shield 5902 reduces crosstalk between interposer conductors 5300 and with suitable adjustments of the shapes, proximities and properties of parts within the signal ground bar assembly 5810 improves the signal integrity of the interposer connector 5800.

Figure 60:
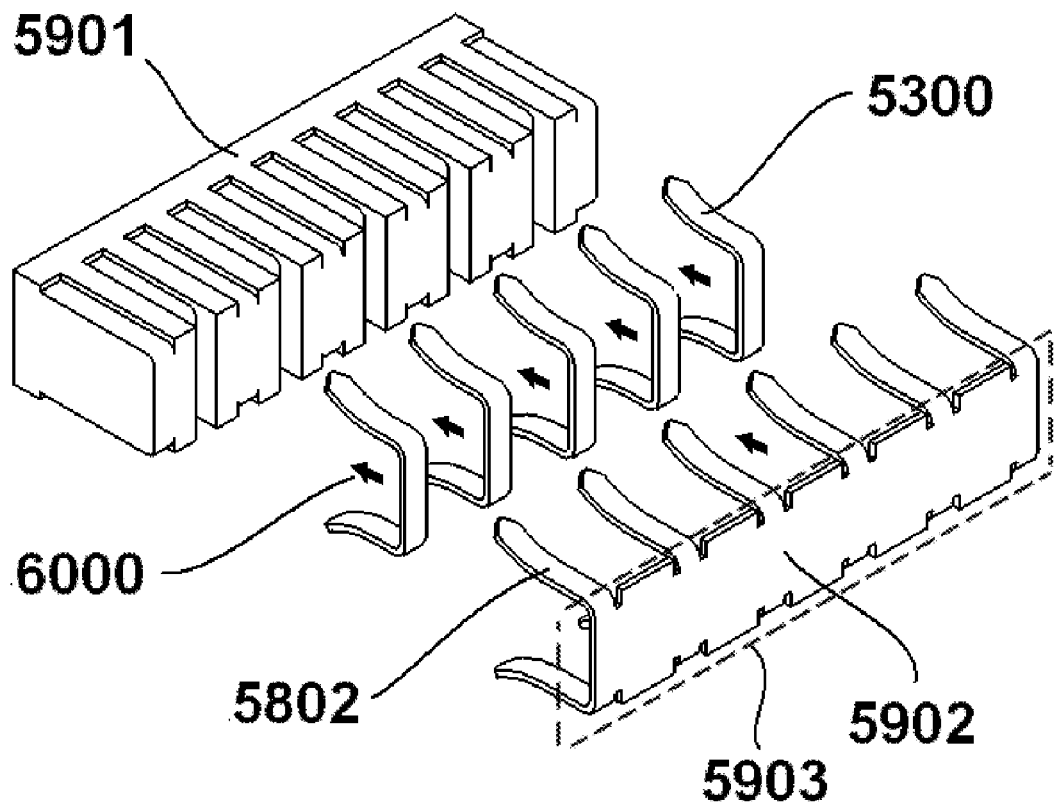
FIG. 60 is an exploded view of the signal ground bar assembly illustrated in FIG. 59.

FIG. 60 illustrates an exploded view of the signal ground bar assembly 5810 in FIG. 59. The interposer conductors 5300 are inserted into the insulator 5901. Next, the ground shield 5902 is inserted into the insulator 5901. The direction of insertion is illustrated by arrows 6000. Instead of separate shielding groundplates 5903, the insulator 5901 could be conductively coated in selected areas. Then the ground shield 5902 could be replaced by interposer conductors 5300 placed in intimate electrical contact with the conductive coatings. The grounded interposer conductors 5300 would replace and/or augment the shielding groundplates with their conductive elements 5802.

The aforementioned embodiments of the electrical interposer connector may electrically interconnect with printed circuit boards, electrical components, or other electrical connectors, all of which may have the appropriate electrical contact areas or conductive elements 500 shown in FIG. 5.

Figure 61:
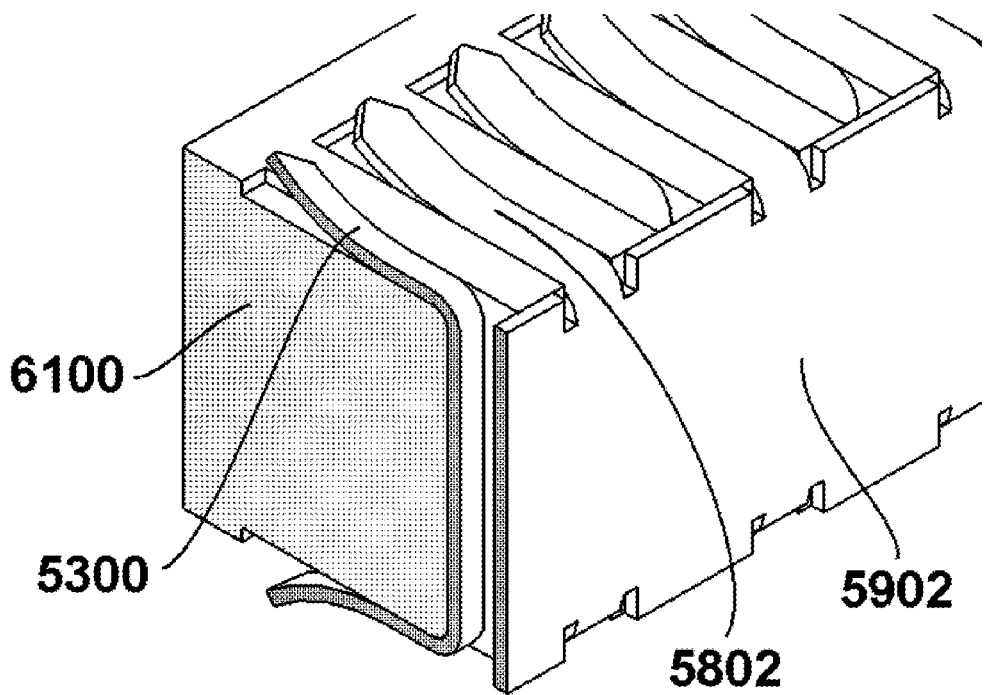
FIG. 61 is a sectioned view through the signal ground bar assembly in FIG. 59.

FIG. 61 illustrates a sectioned view 6100 of the signal ground bar assembly 5810 in FIG. 59. Half of an interposer conductor 5300 is shown. It illustrates how the ground shield 5902 with its grounded conductive elements 5802 follows and can be at the proper distance away from the interposer conductor 5300 to provide electromagnetic shielding and to impart the geometry necessary to provide a uniformity of impedance that improves signal integrity.

Figure 62:
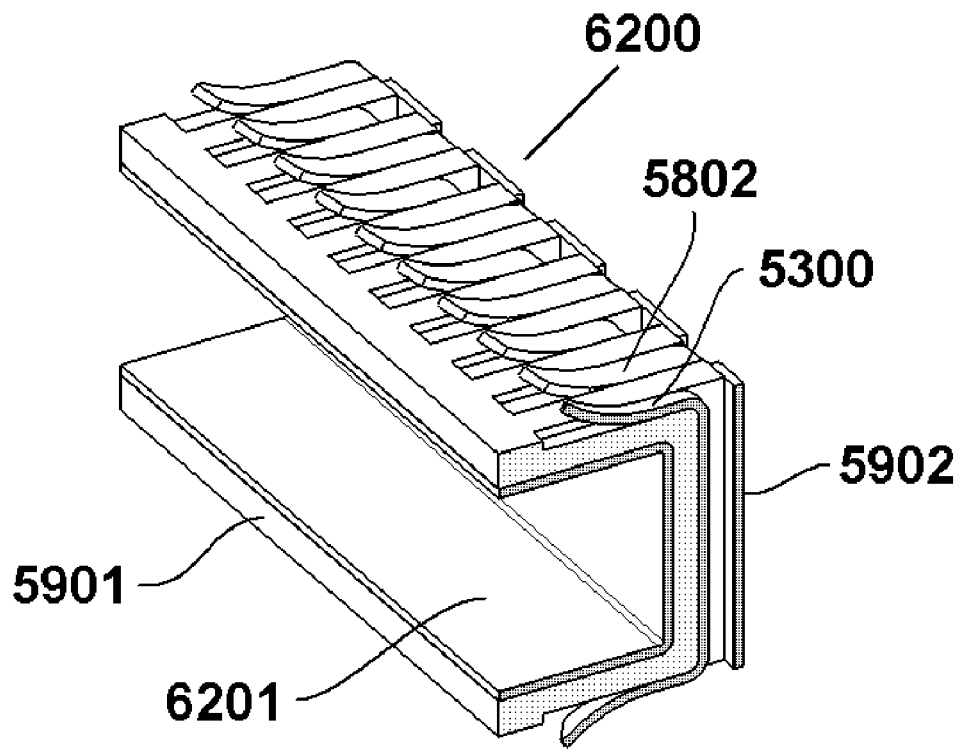
FIG. 62 illustrates a signal ground bar assembly with a cavity in the insulator for an extra ground plane.

FIG. 62 illustrates a sectioned view of a signal ground bar assembly 6200, which is similar to all aforementioned signal ground bar assemblies except for the addition of a conductive ground channel 6201 inside the insulator 5901. The ground channel 6201 and the ground shield 5902 are groundplanes. These two groundplanes 6201, 5902 and the interposer conductors 5300 form stripline transmission lines, which can improve signal integrity and lower crosstalk. The ground channel 6201 may be conductively attached to ground shields in adjacent signal ground bar assemblies. In addition or as an alternative, the ground channel 6201 may be conductively attached at various locations to the ground shield 5902.

Figure 63:
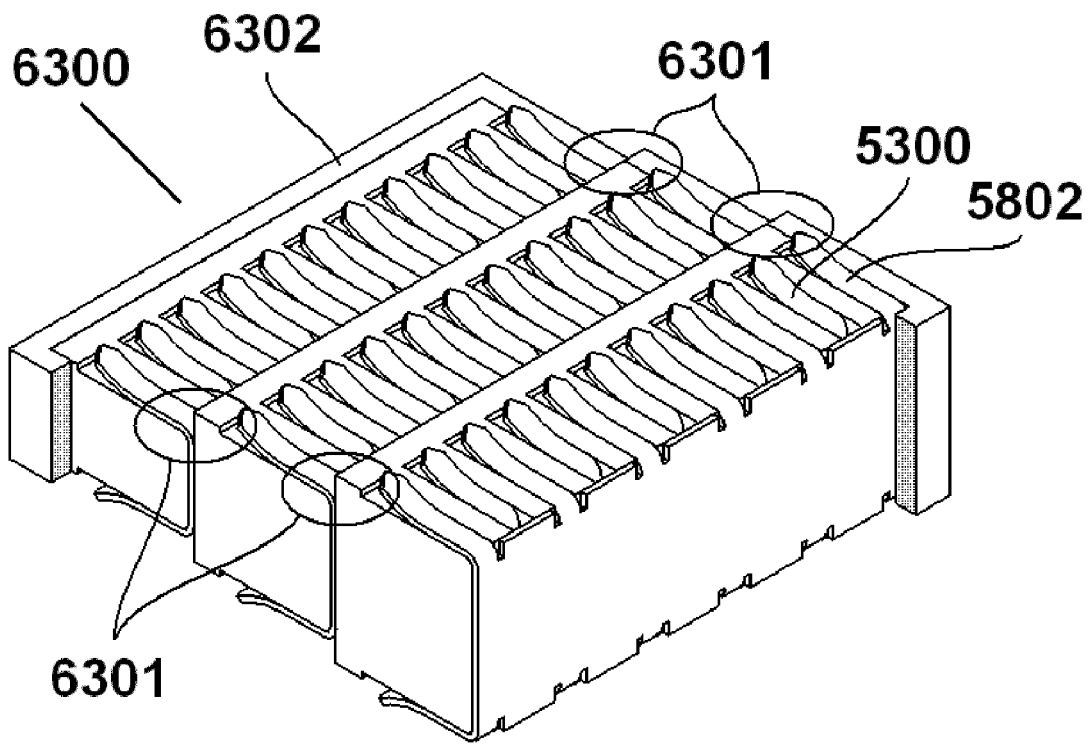
FIG. 63 illustrates an embodiment with the electrical contact rows on different stair step surfaces.

FIG. 63 illustrates an embodiment, an electrical interposer connector 6300 having stair step features indicated by the circled areas 6301. The frame 6302 has been sectioned to show how the stair step features are created by making the height of a signal ground bar assembly greater than the one adjacent to it. The stair step rows of electrical contacts on the interposer conductors 5300 and conductive elements 5802 can electrically mate with corresponding stair step rows of electrical contacts on electrical components or other stair step electrical connectors.

Figure 64:
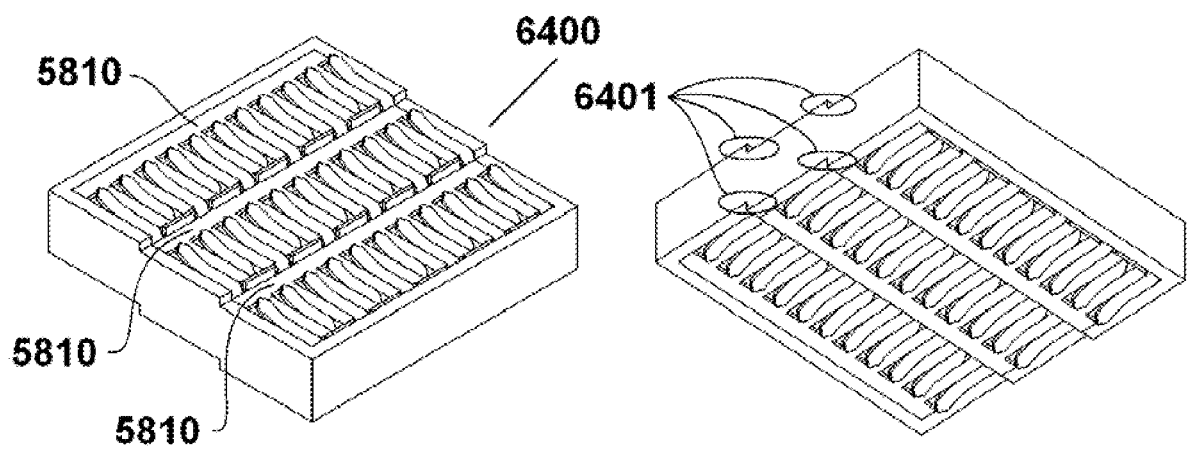
FIG. 64 illustrates another embodiment with the electrical contact rows on different stair step surfaces.

FIG. 64 illustrates an embodiment wherein a stair step electrical interposer connector 6400, in top and bottom isometric views, that has two or more signal ground bar assemblies 5810, all being identical in shape, size and height. The signal ground bar assemblies 5810 are disposed in a stair step arrangement 6401 by vertically offsetting any signal ground bar assembly from the one adjacent to it.

Figure 65:
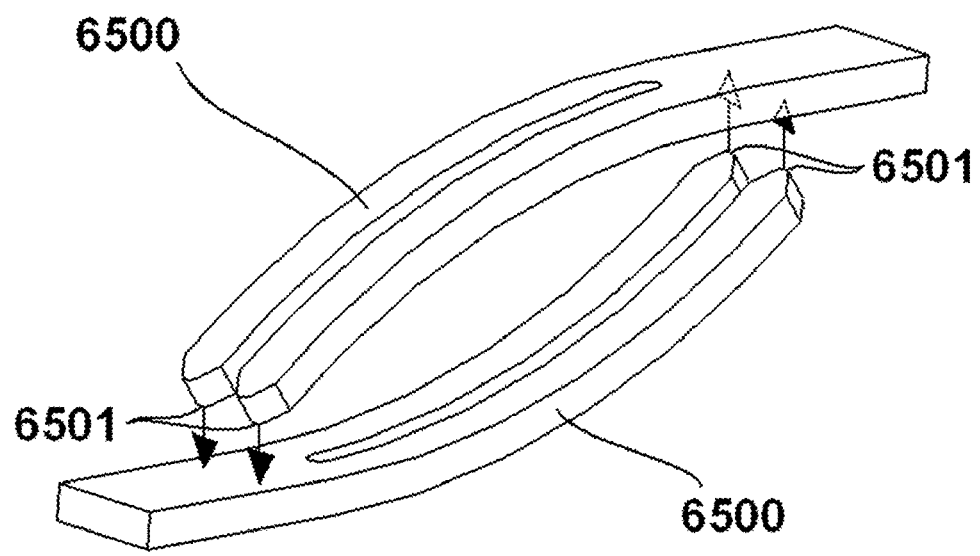
FIG. 65 illustrates an embodiment of the curved conductive elements with multiple electrical contact redundancy.

FIG. 65 illustrates an embodiment of the conductive elements 500 shown in FIG. 5. When electrically mated, the conductive elements 6500, which are oriented in the same manner as those in FIG. 5, may have one or more electrical contact points 6501 per conductive element 6500 to create three or more electrical contacts for an electrical signal to pass through. The geometry that creates this electrical contact redundancy, which increases electrical interconnection reliability, may be replicated in all the other embodiments of the electrical interconnection devices within this document.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. In combination:
    a first electrical connector comprising first and second layers that respectively include parallel first and second primary stair step surfaces and a plurality of primary conductive members, each primary conductive member having a first surface, a second surface, and a proximal section, each proximal section including a landing zone on the first surface, and a first tip section terminating at a tip, wherein the proximal section of a first primary conductive member extends over the first primary stair step surface, and the proximal section of a second primary conductive member extends over the second primary stair step surface; and
    a second electrical connector comprising first and second complementary stair step surfaces and a plurality of complementary conductive members, each complementary conductive member having a first surface, a second surface, and a proximal section, each proximal section including a landing zone on the first surface and a tip section terminating at a tip, wherein the proximal section of a first complementary conductive member extends over the first complementary stair step surface, and the proximal section of a second complementary conductive member extends over the second complementary stair step surface;
    wherein, when the first and second electrical connectors are in a partially assembled state or a fully assembled state, a first landing zone disposed on the first surface within the proximal section, wherein the first tip of the first primary conductive member is in contact with the first landing zone of the first complementary conductive member, and the first tip of the first complementary conductive member is in physical contact with the first landing zone of the first primary conductive member.

2. The combination of claim 1, wherein:
when the first and second electrical connectors are in an unassembled state, the proximal section of the first primary conductive member is curved;
when the first and second electrical connectors are in a partially assembled state, the proximal section of the first primary conductive member comprises a substantially planar section having a first length, and a curved section having a second length; and,
when the first and second electrical connectors are in a fully assembled state, the proximal section of the first primary conductive member comprises a planar section with a third length greater than the first length.

3. The combination of claim 2, wherein the proximal section of the first primary conductive member comprises a resilient material which resistively deflects in a presence of deflection force.

4. The combination of claim 2, wherein, when the first and second electrical connectors are in a partially assembled state or a fully assembled state, the first primary stair step surface exerts a resistive force on the planar section of the first primary conductive member.

5. The combination of claim 2, wherein a partially assembled state, the first surface of the curved section is a concave section, and wherein, in the partially assembled state, the landing zone is disposed in the concave section.

6. The combination of claim 2, wherein the proximal section comprises a substantially uniform thickness.

7. The combination of claim 6, the tip section of the first primary conductive member having first and second edges that taper inward toward the tip.

8. The combination of claim 7, wherein a taper of the tip section comprises two linearly aligned edges that converge and intersect at the tip.

9. The combination of claim 7, wherein, the tip section comprises a curved taper, the tip being disposed at a forward most portion of the curved taper.

10. The combination of claim 1, the first and second layers further comprising parallel third and fourth primary stair step surfaces that are about perpendicular to the first and second primary stair step surfaces, the first conductive member further comprising a distal section extending above the third stair step surface.

11. The combination of claim 1, wherein the first and second circuit layers are flexible circuit layers.

12. The combination of claim 10, the first electrical connector further comprising a connector body with an engagement surface disposed against the first circuit layer, wherein the second circuit layer is disposed against the first circuit layer.

13. The combination of claim 12, the second electrical structure comprising a printed circuit board.

14. The combination of claim 13, the connector body comprising at least one primary mechanical interconnect and the second electrical structure comprising at least one complementary mechanical interconnects configured to mechanically interconnect with the at least one primary mechanical interconnect.

15. An electrical interconnection assembly comprising:
a first interconnect member with parallel first and second stair step surfaces, parallel third and fourth stair step surfaces that are perpendicular to the first and second stair step surfaces, and a first plurality of conductive members, each conductive member having a proximal section terminating at a tip, and a distal section, the first plurality of conductive members including a first conductive member with a proximal section that extends over the first stair step surface and a distal section extending to the third stair step surface, a second conductive member with a proximal section that extends over the second stair step surface and a distal section that extends to the fourth stair step surface; and
a second interconnect member with parallel fifth and sixth stair step surfaces and a second plurality of conductive members, each of the second plurality of conductive members having a proximal section terminating at a tip, including a third conductive member having a proximal section extending above the fifth stair step surface and a fourth conductive member having a proximal member extending above the sixth stair step surface;
wherein the tip of the first conductive member is in contact with the proximal section of the third conductive member, and the tip of the third conductive member is in contact with the proximal section of the first conductive member.

16. The electrical interconnection assembly of claim 15, wherein:
the tip of the second conductive member is in electrical contact with the proximal section of the fourth conductive member; and,
the tip of the fourth conductive member is in electrical contact with the proximal section of the second conductive member.

17. The electrical interconnection assembly of claim 15, wherein the proximal section of the first conductive element comprises a resilient material which resistively deflects in a presence of deflection force.

18. The electrical interconnection assembly of claim 15, wherein the first conductive member is part of a flexible circuit structure.

19. The electrical interconnection assembly of claim 18, the first interconnect structure further comprising a housing member with a first mechanical engagement means, the flexible circuit structure being disposed against a housing member.

20. The electrical interconnection assembly of claim 18, the second interconnect member comprising a printed circuit board and a second mechanical engagement means configured to mate with the first mechanical engagement means.

21. The electrical interconnection assembly of claim 15 wherein the proximal section of the first conductive member comprises a substantially uniform thickness.

22. The electrical interconnection assembly of claim 15, the tip section of the first primary conductive member having first and second edges that taper inward toward the tip.

23. The combination of claim 22, wherein a taper of the tip section comprises two linearly aligned edges that intersect at the tip.

24. The combination of claim 22, wherein the tip section comprises a curved taper, the tip being disposed at a forward most portion of the curved taper.

* * * * *